US012753687B2

(12) United States Patent
Long et al.

(10) Patent No.: US 12,753,687 B2
(45) Date of Patent: Oct. 6, 2026

(54) AUTOMATED WELLBORE PLANNING BASED ON WELLBORE CONDITION

(71) Applicant: Schlumberger Technology Corporation, Sugar Land, TX (US)

(72) Inventors: Derek Long, Cambridge (GB); Maria Fox, Cambridge (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 985 days.

(21) Appl. No.: 17/807,875

(22) Filed: Jun. 21, 2022

(65) Prior Publication Data

US 2022/0403729 A1 Dec. 22, 2022

Related U.S. Application Data

(60) Provisional application No. 63/212,835, filed on Jun. 21, 2021.

(51) Int. Cl.
*E21B 44/00* (2006.01)
*G06F 30/20* (2020.01)

(52) U.S. Cl.
CPC .............. *E21B 44/00* (2013.01); *G06F 30/20* (2020.01); *E21B 2200/20* (2020.05); *E21B 2200/22* (2020.05)

(58) Field of Classification Search
CPC .. E21B 44/00; E21B 2200/20; E21B 2200/22; G06F 30/25; G06F 30/27; G06F 30/28
See application file for complete search history.

(56) References Cited

U.S. PATENT DOCUMENTS

| | | | |
|---|---|---|---|
| 6,424,919 | B1 | 7/2002 | Moran et al. |
| 8,775,347 | B2 | 7/2014 | Goel et al. |
| 2002/0062156 | A1 | 5/2002 | Yamakawa et al. |
| 2004/0088115 | A1 | 5/2004 | Guggari et al. |
| 2005/0027495 | A1 | 2/2005 | Matichuk |
| 2005/0209836 | A1 | 9/2005 | Klumpen et al. |
| 2005/0209912 | A1 | 9/2005 | Veeningen et al. |
| 2008/0275594 | A1 | 11/2008 | De Guzman |
| 2008/0281525 | A1 | 11/2008 | Boone |
| 2008/0306803 | A1 | 12/2008 | Vaal et al. |

(Continued)

OTHER PUBLICATIONS

Cárdenas, Jorge Luis, et al. "Wellbore Cleanup Tools Save Rig Time in Approximately 30% Optimizing Workover and Completion Operations." SPE Annual Technical Conference and Exhibition?. SPE, 2011 (Year: 2011).*

(Continued)

*Primary Examiner* — Saif A Alhija
(74) *Attorney, Agent, or Firm* — Kyle R. Miiller

(57) ABSTRACT

Systems and methods facilitate wellbore planning and cleaning operations, and generally relate to use of a planning system that interfaces with a simulator. The planner and simulator interact, via the interface, to evaluate various wellbore plans and the effects of the plans on cuttings accumulation, cuttings transport, wellbore geometry, or other borehole conditions. The cost, risk, time, or other associated outcomes of the plans can be compared and evaluated and selected. The plan is then implemented. Planning can continue in substantially real-time to continue modifying the plan to provide a desired balance of outcomes.

17 Claims, 10 Drawing Sheets

(56) References Cited

U.S. PATENT DOCUMENTS

| | | | | |
|---|---|---|---|---|
| 2009/0132458 | A1 | 5/2009 | Edwards et al. | |
| 2010/0332442 | A1 | 12/2010 | Goel et al. | |
| 2011/0172976 | A1 | 7/2011 | Budiman et al. | |
| 2012/0054246 | A1 | 3/2012 | Fischer | |
| 2013/0025937 | A1 | 1/2013 | Pilgrim et al. | |
| 2013/0231787 | A1 | 9/2013 | Chapman et al. | |
| 2014/0128996 | A1 | 5/2014 | Sayyarrodsari et al. | |
| 2014/0208253 | A1 | 7/2014 | Pettus et al. | |
| 2014/0214469 | A1 | 7/2014 | Callow et al. | |
| 2014/0246238 | A1 | 9/2014 | Abbassian et al. | |
| 2016/0273330 | A1 | 9/2016 | Dashevsky et al. | |
| 2016/0290118 | A1 | 10/2016 | Xue et al. | |
| 2017/0370191 | A1 | 12/2017 | Fox et al. | |
| 2018/0012310 | A1 | 1/2018 | Fox et al. | |
| 2018/0045031 | A1* | 2/2018 | Shaposhnikov | E21B 33/14 |
| 2020/0370409 | A1* | 11/2020 | Yu | E21B 47/12 |

OTHER PUBLICATIONS

Pinheiro, Marisa, et al. "Boreholes plans optimization methodology combining geostatistical simulation and simulated annealing." Tunnelling and Underground Space Technology 70 (2017): 65-75. (Year: 2017).*

Halafawi, Mohamed, and Lazar Avram. "Wellbore trajectory optimization for horizontal wells: the plan versus the reality." Journal of Oil, Gas and Petrochemical Sciences 2.1 (2019): 49-54. (Year: 2019).*

Tahir, Muhammad, et al. "Optimum Well Trajectory Design and Optimization Based on Numerical Optimization Method PSO Algorithm and Wellbore Stability." Petroleum & Coal 62.1 (2020). (Year: 2020).*

International Search Report and Written Opinion in International Patent Application No. PCT/US2015/067134, dated Apr. 1, 2016, 13 pages.

International Preliminary Report on Patentability in International Patent Application No. PCT/US2015/067134, dated Jun. 29, 2017, 10 pages.

International Search Report and Written Opinion in International Patent Application No. PCT/US2016/012254, dated Apr. 21, 2016, 17 pages.

International Preliminary Report on Patentability in International Patent Application No. PCT/US2016/012254, dated Jul. 11, 2017, 8 pages.

Firby, R.J., "Adaptive Execution in Dynamic Domains", Ph.D. Thesis, Yale University Department of Computer Science, 1989, 374 pages.

Simmons et al., "A Task Description Language for Robot Control," Proceedings of the Conference on Intelligent Robotics and Systems, Vancouver, BC, Canada, Oct. 1998, 7 pages.

Gat, Erann, "ESL: A Language for Supporting Robust Plan Execution in Embedded Autonomous Agents", Proceedings of the AAAI Fall Symposium on Plan Execution, 1997. 6 pages.

Berry, G., "The Esterel v5 Language Primer", version 5.21 release 2.0, Centre de Mathematiques Appliquees, Ecole des Mines and INRIA, Apr. 6, 1999, 140 pages.

Ingham et al., "2001: A Reactive Model-Based Programming Language for Robotic Space Explorers", Proceedings of ISAIRAS-01, Jun. 2001, 8 pages.

Office Action in U.S. Appl. No. 15/536,693, dated Apr. 2, 2019, 47 pages.

Office Action in U.S. Appl. No. 15/536,693, dated Dec. 7, 2021, 21 pages.

Office Action in U.S. Appl. No. 15/541,381, dated Jan. 3, 2020, 17 pages.

Office Action in U.S. Appl. No. 15/541,381, dated Apr. 24, 2019, 38 pages.

Nunes, V. T., "Dynamic process adaption: Planning in a context-aware approach", August Diss. PhD Thesis in Computer Science and System Engineering, COPPE-Federal University of Rio de Janeiro, Rio de Janeiro, Brazil, 2014 133 pages.

Notice of Allowance in U.S. Appl. No. 15/536,693, dated Sep. 20, 2022, 13 pages.

Quintero, E. et al., "Control of Autonomous Mobile Robots with Automated Planning", Journal of Physical Agents, 5(1), 2011, 11 pages.

* cited by examiner

AUTOMATED WELLBORE PLANNING BASED ON WELLBORE CONDITION

CROSS-REFERENCE TO RELATED APPLICATIONS

This application claims the benefit of, and priority to, U.S. Patent Application No. 63/212,835, filed Jun. 21, 2021, which application is expressly incorporated herein by this reference in its entirety.

BACKGROUND

Automated planning defines a framework to describe the physical world associated with a goal-oriented activity. This is done through modelling a finite set of actions that can change the state of the world or environment in which an activity is being carried out. The state of the world and changes to the state of the world are detected (e.g., by sensors) and registered. A new plan may be made based on the detected state of the world.

Dynamic automated planning generally includes choosing and scheduling a number of actions that will change the state of the world, or an environment in which the activity is being carried out, from an initial state to a goal state. Each action carried out to achieve the goal has an effect on a predetermined number of state variables and can only be executed if a given set of conditions based on another predetermined number of state variables are met.

When an action identified by a plan is physically executed, if the action does not have the expected effect on the world, the plan that generated that action is said to fail. Then a new plan is built starting from the new current initial state, which is the state reached after execution of the failed action. For example, in the drilling domain, the action of drilling to the next connection in a drill string can take as a precondition that the drilling bit is on the bottom of the wellbore that has been drilled to this point, and can have as an effect on the world that the hole depth has increased by the length of a stand, since the last connection. A stand is a subsection of drill piping from which the drill string is generally constructed in sections, and generally is a drill pipe section of a certain set length, ranging from around 30 feet (10 m) to 90 feet (30 m).

Applied to the upstream oil and gas drilling domain, a drill-a-stand plan would get the world from an initial state, in which the string is in slips with a new portion of a drill pipe (stand) being above the stick-up point at the beginning of stand number n, to a goal state, in which the string is in slips with the same stand being below the stick-up point at the end of the drilling of stand number n.

Planners may solve problems where the majority of the decision space involves discrete decision variables. For instance, a planner may analyze how to achieve a goal from a specified initial state, using some organization of specified possible actions. The actions represent a model of the intended behavior, describing what effects can be anticipated when each action is applied, provided that it is applied when appropriate preconditions (as described in each action model) are satisfied.

The model represented by the collection of actions may be written in an appropriate modelling formalism (such as the Planning Domain Description Language (PDDL)) in order to separate the model from the planner itself. The expressive power of this modelling formalism may be limited to generic basic mathematical functions and may be unsuitable for capturing complex physical systems. As a consequence, conventional planners may not construct plans in contexts in which the actions interact with complex physical systems.

SUMMARY

A summary of certain embodiments described herein is set forth below. It should be understood that these aspects are presented merely to provide the reader with a brief summary of these certain embodiments and that these aspects are not intended to limit the scope of this disclosure.

In some embodiments, the techniques described herein relate to a method for generating wellbore plans. A wellbore planning and simulation system connects a borehole condition simulator to a generic planner not designed to specifically consider borehole conditions. The system evaluates a wellbore plan prepared by the generic planner for state data, the state data including a drilling parameter and performs a simulation of borehole conditions using the state data and based on the borehole conditions, the simulation determining whether one or more planned operations received from the planner will improve or maintain the borehole conditions during a drilling operation. A wellbore system performs the one or more recommended operations.

In some embodiments, the techniques described herein relate to a method by a generic planner that is designed to generate a wellbore plan independent of specific borehole conditions (e.g., without considering specific borehole conditions). The generic planner generates the wellbore plan, the generic planner generating state data and a query for borehole conditions based on the state data. The generic planner transmits the state data and the query to a borehole condition simulator, the borehole condition simulator being configured to generate a borehole simulation using the state data. The generic planner receives a response to the query from the borehole condition simulator, the response to the query being based on the borehole simulation in view of the state data provided to the borehole condition simulator.

According to an embodiment of the present disclosure, a method or system includes use of a generic interface supporting attachment to an automated planner of a dynamic state-dependent simulator.

According to another embodiment of the present disclosure, an interface connects a generic planner to a borehole condition simulator that simulates an evolution of cuttings concentrations in a deviated borehole, with the planner deciding when to clean the borehole.

According to another embodiment of the present disclosure, a wellbore cleaning plan is performed with a planning and simulator interface, in which multiple drilling problems are solved for different pump rates and rates of penetration (ROPs).

According to another embodiment of the present disclosure, a method includes evaluating a global risk incurred by a plan.

According to another embodiment of the present disclosure, a method includes comparing plans in terms of a risk-cost trade-off.

According to another embodiment of the present disclosure, a method includes exploring alternative cleaning strategies during well design.

According to another embodiment of the present disclosure, a method includes generating plans that approximate background physics well enough to improve efficiency and safety of well construction.

According to another embodiment of the present disclosure, a method includes reducing non-productive time (NPT) that arises from imposing conservative schedules of activities such as cleaning.

According to another embodiment of the present disclosure, a method includes evaluating plans in terms of a tradeoff of risk against cost.

According to another embodiment of the present disclosure, a method includes exploring the space of alternative plans, generated automatically or otherwise, to assist in evaluating different cleaning strategies, equipment configurations, etc.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings, in which:

FIG. 3-1 and FIG. 3-2 are schematic illustrations of a wellbore planning and simulation system, according to at least one embodiment of the present disclosure;

FIG. 4-1 and FIG. 4-2 are representations of planning diagrams for a wellbore planning and simulation system, according to at least one embodiment of the present disclosure;

DETAILED DESCRIPTION

Figure 1:
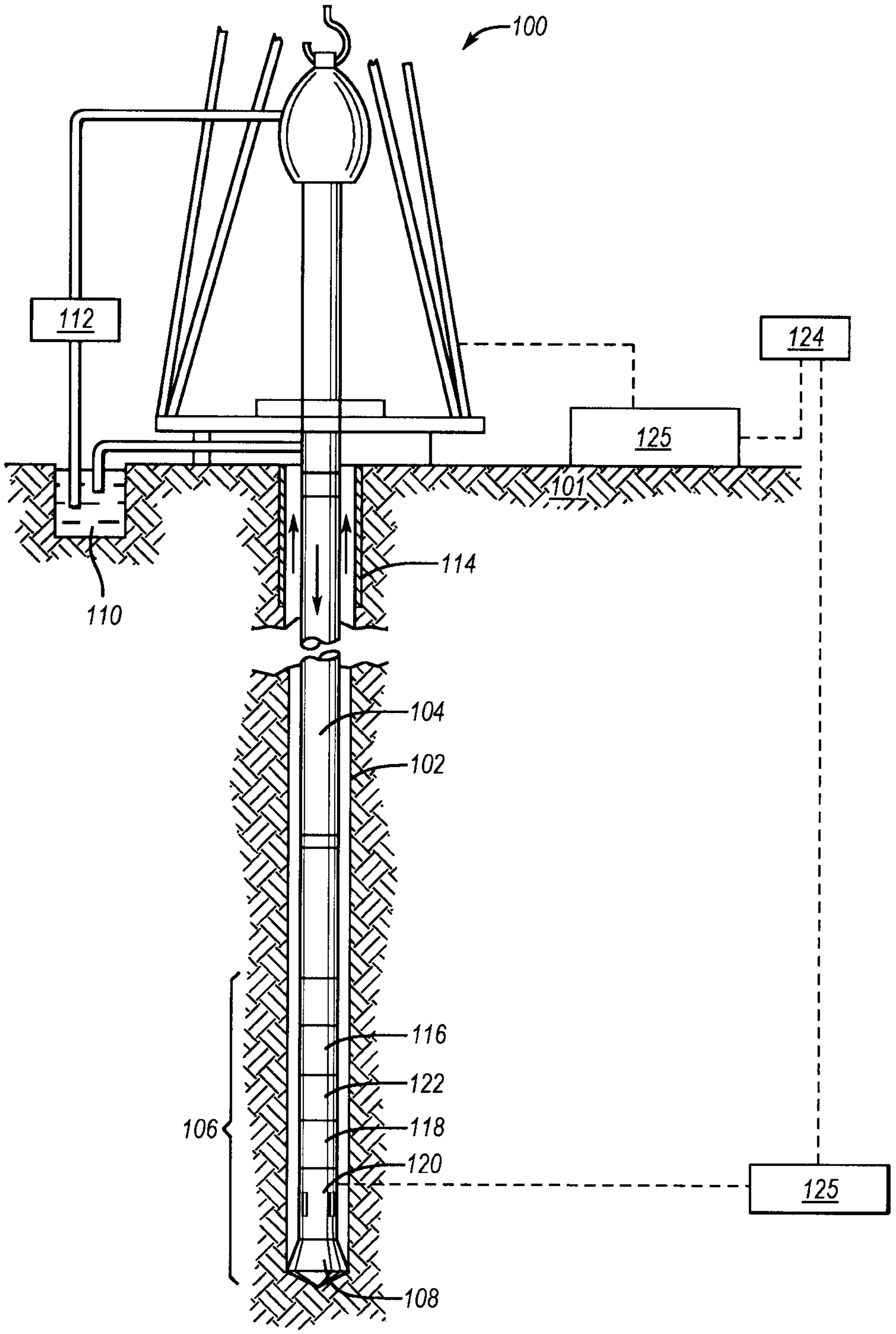
FIG. 1 is a schematic illustration of a wellsite system, according to at least one embodiment of the present disclosure.

Embodiments of the present disclosure relate generally to automated planning. More particularly, aspects of the present disclosure relate to a scalable infrastructure for supporting an automated planner with an interface to one or more solvers capable of simulating the effects of an action on the environment. For instance, an automated planner may interface with a borehole simulator capable of simulating some of the effects of drilling on borehole condition. Example conditions may include borehole shape (e.g., geometry, tortuosity, cave-in likelihood, etc.) and transport conditions (e.g., ability or ease of transporting cuttings).

An aspect of some embodiments of the present disclosure is that the approach is generic. Planner models are generic and prioritize identifying generic relationships between activities in plans. But planner models may not incorporate physical models. For example, a planner model may not include a physics-based model, or a physics-based model of physical conditions. In some situations, a planning model may utilize a modeling language, such as PDDL. The planning language may not have the capacity for or the ability to perform physics-based modeling. This may be, at least in part, based on the limited ability of PDDL to encode and perform higher-level mathematics, such as complex calculus, partial differential equations, linear algebra, and so forth. Physics-based models, such as borehole shape and/or transport condition models, may utilize higher-level mathematics to perform their simulations (such as multi-variate differential or partial differential equation models).

In accordance with at least one embodiment of the present disclosure, the planner may query a solver to determine how planning state data may impact physical conditions. The planner may include an interface between the planner and the solver. The interface may convert the query and/or planning state data into a format usable by the solver. The interface may generate an interface object to pass between the generic planner and the solver. The solver may perform a simulation of physical conditions based on the query and the planning state data. After performing the simulation, the solver may send the simulation results to the planner. In some embodiments, the solver may send the simulation results to the planner using the interface, and the interface may convert the simulation results a format usable by the planner. In this manner, the planner, which may not be designed (or capable) to specifically consider physical conditions may receive physical condition simulations from a solver.

The planning and simulation system provides many advantages and benefits over conventional systems and methods. For example, the planning and simulation system may utilize any solver. For example, an interface object may be generated by an interface at the planner to provide the solver with usable planner state data. When the planner is integrated with a solver, planning state data carry approximations of a persistent physical state as determined by the solver. When a plan has been constructed, the simulation of the evolving background physical model may be "played back" over the trajectory of the plan. This allows alternative scenarios to be explored during offline design or other planning activities. In some embodiments, this may allow the planner to identify a fast, but less precise simulation for some decisions and a more accurate but slower simulation for others, with the same planning model and the same planner.

In some embodiments, the automated planning method may be fully domain-independent. Put another way, the automated planning method may be independent of the type of model used. This may be because the interface, and not the planner, may include functionality to interpret the externally computed information, including conversion functions to convert planner state data into usable information by the solver and/or convert simulation data into usable information by the planner. No modifications may need be made to the planner, or to the modelling language (e.g., PDDL), to support the interface. Some methods described herein can provide a fully generic way to interface planning with different simulators and support utilization by the planner of dynamic state-dependent external advice.

In further embodiments, execution of operations using a plan developed using methods described herein may be more efficient and less likely to fail than when a solver has not been used. This may reduce NPT because time-consuming actions (e.g., for time allocated to maintaining a borehole condition) will be planned when as determined by the solver, rather than as a matter of course. Increased reliability may follow because human operators will be following actions that are appropriate to the physical condition of the environment and therefore not dismissed as unnecessary in the operational context. Any shortcomings in the integrity of the solver can be made up for during execution, using the existing plan failure, and re-planning functionality of drill-a-stand process.

In some embodiments, when planning to achieve a goal (e.g., achieve a certain drilling rate, achieve a certain depth), the planner may look ahead to determine how sequences of actions will bring about a future state that satisfies that goal. Because it can estimate the future condition using the solver, the planner may choose actions in the current state that are conditioned on that future state rather than on purely local considerations. As an example, if the end of a current drilling run is 100 m away, the planner may choose not to plan cleaning actions between the current state and the end of the run because—according to the solver—cuttings will not build up in time to pose a problem before the end of run is reached. This decision may be altered during execution if unforeseen conditions cause cuttings to accumulate in a way that was not predicted by the simulator, or if cuttings are cleared faster than expected.

As a specific example, planning can be integrated with a simulation of a process by which cuttings accumulate in the borehole during drilling. In drilling, when the planner is attempting to reach a goal, it considers alternative actions in terms of how much they contribute towards achieving that goal. For example, when the planner considers the action to turn off the pumps, the simulator computes an approximation of the physical effects on the distribution of cuttings that would result if the pumps were turned off in the current state. By integrating with a simulator, the planner may not use or require a model of the physical processes themselves, but is enabled to make decisions that depend on having an approximate understanding of their effects. In the above example, if the simulator calculates that cuttings concentration somewhere in the borehole will exceed an acceptable threshold if the pumps are turned off at a given point in time, the planner will choose to clean the borehole before turning off the pumps. Thus, depending on the simulated evolution of the borehole state throughout the plan, drilling a single stand might include any number, or duration, of cleaning actions, or none at all.

A solver of the present disclosure may include a borehole condition simulator. The borehole condition simulator may take into account various additional conditions, such as the borehole inclination and the suspension and bedding behavior of cuttings, along with hose these are affected by drilling operations. Consequently, use of a simulator may allow the planner to include more intensive cleaning in inclined wellbore sections than in vertical sections. Cleaning on a fit-for-function approach used by a planner can lead to a reduction in NPT compared with using a fixed cleaning schedule.

Planning methods of some embodiments of the present disclosure can be run multiple times with different parameter settings and limits, to create a space of alternative plans that can be evaluated before execution begins. Such planning can result in plans that can be evaluated in terms of a risk-cost trade-off. In the above example, if the acceptable threshold is set to be high, the planner can choose to perform an action less often. In the example of borehole cleaning, this may result in plans that incur lower cost in terms of time spent cleaning the borehole and a consequently higher risk of an unwanted event, according to the simulator. If the threshold is set to be low, the planner will advise more time is spent cleaning to achieve a lower overall risk. Such an approach therefore allows an objective comparison between plans based on risk thresholds, cleaning strategies, equipment replacement schedules, and so on. Additional economic constraints can be used to choose between plans in the cost-risk trade-off space. For example, some of the plans in the high-cost, low-risk dimension may incur unnecessary NPT, while some in the low-cost high-risk dimension may be unlikely to satisfy a client's safety requirements.

As illustrated by the foregoing discussion, the present disclosure utilizes a variety of terms to describe features and advantages of the automated planning and simulation. Additional detail is now provided regarding the meaning of such terms. For example, as used herein, the term "planner," "wellbore planner," or "automated planner" refers to a planning program that prepares plans for managing wellbore activities. For instance, the term "planner" may refer to a planner that prepares a plan to drill a single wellbore. In some instances, the term "planner" may refer to a planner that prepares a plan to drill multiple wellbores. In some embodiments, the planner may be a generic planner. In some embodiments, a generic planner may include a system that builds plans without any prior assumptions about the nature of the actions that will be used in the construction of those plans. The generic planner may receive descriptions of those actions as part of the input. The generic planner itself, or the underlying program of the generic planner, may not be changed as a consequence of being switched to apply to different problems. In some embodiments, a generic planner may be a planner that is configured to plan any operation, including non-drilling operations.

As used herein, a "borehole condition simulator" may refer to a simulator that considers borehole conditions to prepare a simulation of borehole conditions. For example, a borehole condition simulator may consider formation type, drilling equipment, drilling parameters, and other state data to prepare a simulation of borehole conditions. The borehole condition simulator may prepare a physical simulation the wellbore. In some embodiments, a particular borehole condition simulator may be prepared to analyze a particular borehole condition. For example, a borehole condition simulator may be prepared to measure borehole deviation, borehole tortuosity, borehole stability, cuttings transport, equipment wear-and-tear, borehole stability, any other borehole condition, and combinations thereof.

As used herein, "state data" may refer to any information related to the state of the wellbore plan. In some embodiments, state data may include a configuration of controllable variable associated with equipment considered by a planning and simulation system. In some embodiments, the state data may be associated with a current configuration of controllable variables. In some embodiments, the state data may be associated with a planned or predicted configuration of controllable variables. In some embodiments, the controllable variables may be discrete variables. In some embodiments, the state data may be prepared as a valuation, or a vector of values associated with a vector of variables. The vector of values associated with the vector of variables may be updated based on a state of the equipment used in the plan. In some embodiments, the vector of variables may be fixed for a particular plan (as defined by the planning model). In some embodiments, a range of possible values for the vector of variables may be defined in the planning model. In some embodiments, an initial state of the vector of variables may be a particular valuation. A planning goal may involve a plan to move from the initial state of the vector of variables to a planned state of the vector of variables.

In some embodiments, the state data may include variables related to drilling parameters, such as volumetric fluid flow (e.g., the pump rate of a drilling fluid through the wellbore), fluid pressure, drilling fluid type, formation type, weight on bit (WOB), rotational rate of the bit in rotations per minute (RPM), any other drilling parameter, penetration rate, and combinations thereof. In some examples, state data may include variables related to progress of the wellbore, such as wellbore depth, wellbore trajectory, wellbore diameter, any other parameter related to wellbore progress, and combinations thereof. In some examples, state data may include information related to operation of the drilling operation, such as equipment type, equipment ID, personnel on-site, client information, sub-contractor information, any other operational information, and combinations thereof. In some examples, state data may include any other variables related to wellbore planning, and combinations thereof.

As used herein, a "solver" is a simulator that may simulate physical conditions of an operation. The solver may include a model, such as a physics-based model to simulate the physical conditions of an operation. The solver may model any condition. For example, the solver may model any type of drilling condition, including cuttings transport, borehole shape, drilling fluid flow, drilling fluid pressure, wireline transport through a wellbore, any other drilling condition, and combinations thereof. While embodiments and specific examples described herein may discuss the solver as a borehole condition simulator, it should be understood that the solver is not so limited, and may include any simulator of physical conditions. As used herein, while the planner may provide a solution to planning problems, the planner and solver are distinct entities.

Some embodiments of the present disclosure are discussed with respect to a wellbore used in the exploration, production, or transport of natural resources. FIG. 1, for instance, illustrates an example wellsite system 100 for use with some embodiments described herein. The wellsite system 100 may be onshore or offshore. In this example, a wellbore 102 is formed in a subsurface formation 101 by drilling. The method of drilling to form the wellbore 102 may include, but is not limited to, rotary and directional drilling. A drill string 104 is suspended within the wellbore 102 and has a bottom hole assembly (BHA) 106 that includes a drill bit 108 at its lower end.

Some embodiments of a surface system include a platform, derrick, or rig 103 positioned over the wellbore 102. An example of the wellsite system 100 includes a rotary table, a kelly, a hook, and a rotary swivel. The drill string 104 is rotated by the rotary table or top drive and energized by a suitable system which engages the kelly at the upper end of the drill string 104. The drill string 104 is suspended from the top drive or a hook attached to a traveling block, and through the kelly and the rotary swivel which permits rotation of the drill string 104 relative to the surface system.

Some embodiments of the surface system also include a drilling fluid 110, e.g., drilling mud, stored in a pit or tank at the wellsite. A pump 112 delivers the drilling fluid 110 to the interior of the drill string 104 (e.g., via one or more ports in a swivel), causing the drilling fluid 110 to flow downwardly through the drill string 104. The drilling fluid exits the drill string 104 via one or more ports in a drill bit 108, circulation sub, or other tool, and then circulates upwardly through the annulus region between the outside of the drill string 104 and the wall of the wellbore 102 or casing 114. In this manner, the drilling fluid 110 lubricates the drill bit 108 and carries formation cuttings and particulate matter up to the surface as it is returned to the pit for recirculation.

The illustrated embodiment of the bottom hole assembly 106 includes one or more logging-while-drilling (LWD) modules 116, one or more measuring-while-drilling (MWD) modules 118, one or more drilling modules 120 (including motors and/or directional drilling tools), other tools 122, and the drill bit 108. These tools are optional and can include additional or fewer tools or modules. For instance, a mill, reamer, or other tool may be used as, or in addition to, the drill bit 108, or the MWD or LWD may be used without the drilling module 120, or vice versa.

The LWD module 116 may be housed in any type of drill collar, and includes capabilities for measuring, processing, and storing information, as well as for communicating with the surface equipment. The LWD module 116 also may include pressure measuring device and one or more logging tools.

The MWD module 118 also may be housed in a type of drill collar, and includes one or more devices for measuring characteristics of the drill string 104 and drill bit 108. The MWD module 118 also may include one or more devices for generating electrical power for the downhole system. In some embodiments, the power generating devices include a mud turbine generator powered by the flow of the drilling fluid 110. In other embodiments, battery or other power systems may be employed to generate power. The MWD module 118 also may include one or more of the following types of measuring devices: a weight-on-bit measuring device; a torque measuring device; a vibration measuring device; a shock measuring device; a stick-slip measuring device; a direction measuring device; an inclination measuring device; a mud density measuring device; or a mud weight or mud composition measuring device. These measuring devices may be used individually or in various combinations.

In an operational example, the wellsite system 100 of FIG. 1 is used in conjunction with surface equipment that may be used for various purposes, including steering the drill string 104, connecting and disconnecting drill pipe segments as the drill string 104 is lowered or raised, measuring surface or downhole conditions, performing a clean-out operation, and the like. This equipment may include the use of computing systems 124 located at the wellsite system 100 or remote from the wellsite (e.g., connected by a communication link with the wellsite system 100). In some embodiments, the computing systems 124 may include, or be connected to, sensors or other evaluation or planning equipment 125 at downhole, surface, or other locations. Such equipment 125 may be used to evaluate downhole or surface conditions and may be included within, or connected by a wired or wireless link to downhole tools in the BHA, other components of the drill string 104, or to the surface system. Such equipment 125 may be used for planning activities during creation of a well plan, during drilling or other wellbore operations, or in both circumstances. In still another example embodiment, the equipment 125 may be used to evaluate the properties and composition of the drilling fluid 110 and may include interfaces to receive the results of manual or other tests performed on the drilling fluid 110, downhole tools, formation 101, and the like. In response to measurements or calculations performed by the equipment 125, modifications may be made to the operation of downhole or surface components, or to the composition of the drilling fluid 110.

During drilling, the BHA 106 will experience various vibrational and other forces, and the forces may vary (oftentimes significantly) between different tools or positions in the BHA. For instance, a drilling module 120 may include a directional drilling module, including a mud motor or rotary steerable system (RSS) that drills a directional/inclined wellbore, and various modes of vibration and resonance may occur below the drilling module 120 (or below the RSS or motor thereof).

In connection with a wellsite system such as that illustrated in FIG. 1, the equipment 125 may include, or be connected to, a planner. In some aspects, equipment 125 supports or includes a fully generic interface supporting attachment to an automated planner of a dynamic state-dependent simulator. In the same or other embodiments, the interface connects an implementation of a PDDL planner to a borehole condition simulator which simulates the evolution of cuttings concentrations in a deviated borehole and supports the planner in deciding when to clean the borehole. Successful application of the resulting integrated system can be used to solve various questions. For instance, multiple drilling problems can be solved for using different pump rates and ROP.

The equipment 125 and planners and/or simulators coupled thereto, can therefore be used to evaluate the global risk incurred by a plan, to compare plans in terms of a risk-cost trade-off, or to explore alternative strategies (e.g., cleaning strategies) during well design. For example, the risk associated with cleaning and cuttings transport may be related to the pipe getting stuck if cuttings accumulate too much. But if too much time is spent flushing cuttings out of the wellbore, then the overall ROP may be reduced for the wellbore. Awareness of the correlation between the pipe getting stuck and time spent cleaning the pipe may allow the planner to mitigate the risk by applying appropriate actions to reduce cuttings concentration. For example, the planner may consider the balance between risk tolerance, the cost of mitigation, the impacts of other actions, and the other factors involved in wellbore drilling.

A planner of the present disclosure may use existing or custom specifications. For example, an existing planner (such as POPEX based on POPF 2008; METIS available from Schlumberger Ltd.) may be used in some embodiments. Interfaces may be developed to interact with proprietary or existing planners, and can support one or more of dynamic state-dependent simulation, global risk measurements, application to planning using borehole condition simulation in a well construction or maintenance context, populating a risk-cost trade-off, or use of a scenario exploration tool.

In accordance with some embodiments, a fully automated temporal numeric planner (e.g., POPEX or METIS) can therefore be used with an interface to permit the attachment of a simulator. Embodiments also contemplate recording the results of simulation in the planning state, support for user-defined functions to interpret the simulation results for the planner's use, methods for efficiently updating the simulated borehole using the simulator, computing global risk, comparing plans, or combinations of the foregoing.

Figure 2:
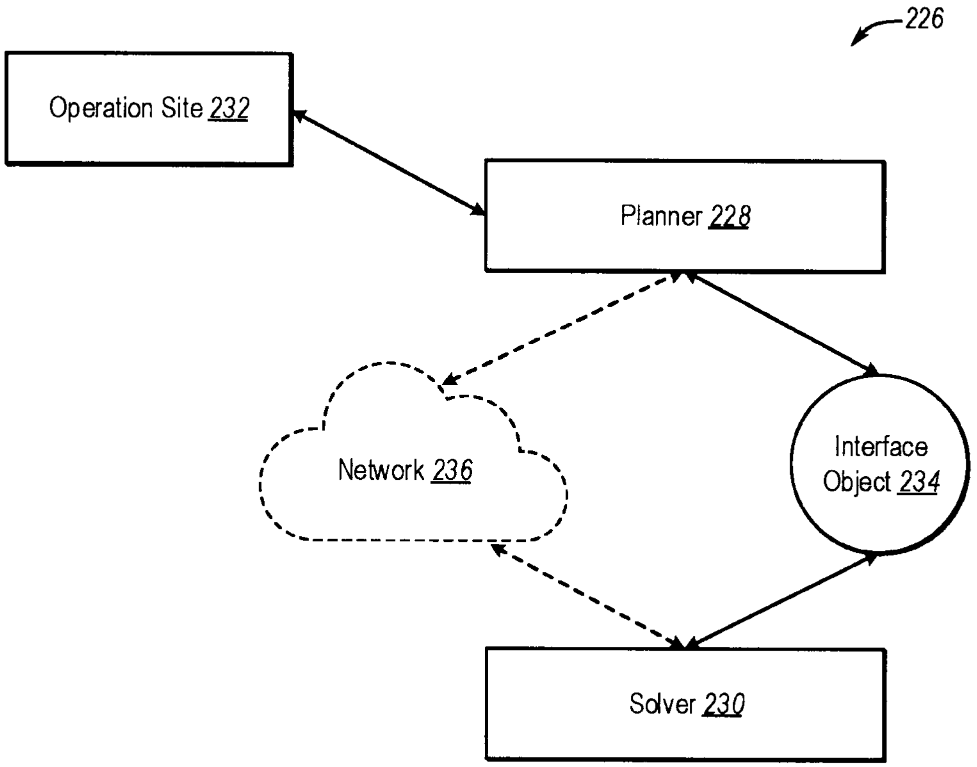
FIG. 2 is a schematic illustration of a planning system environment, according to at least one embodiment of the present disclosure.

FIG. 2 is a representation of a planning and simulation system 226, according to at least one embodiment of the present disclosure. The planning and simulation system 226 includes a generic planner 228. As discussed herein, the generic planner 228 may generate a plan to drill a wellbore. The generic planner 228 may be in communication with a solver 230. In some embodiments, the generic planner 228 may be in communication with an operation site 232.

As an example, the generic planner 228 may include a wellbore planner that is a part of an automated drilling system. The generic planner 228 may receive state data from the operation site 232 and prepare wellbore plans based on the received state data. The generic planner 228 may further transmit the wellbore plan to the operation site 232. For example, the generic planner 228 may provide equipment at the operation site 232 with instructions regarding tasks to perform to drill the wellbore.

In some embodiments, the solver 230 may receive state data from the generic planner 228 to prepare a simulation of physical conditions (such as borehole conditions). The generic planner 228 may communicate state data to the solver 230 through an interface object 234. For example, the generic planner 228 may be designed to determine the plan independent of physical conditions (e.g., without being designed to consider physical conditions). Indeed, the generic planner 228 is designed without being configured to project the impact of planning decisions on planning conditions.

For example, a planner language, or a domain modelling language in which the generic planner 228 is modelled (such as PDDL) is without a capability to perform higher-order mathematical functions as would be involved in simulating borehole conditions. This lack of consideration of borehole conditions may reduce the ability of the generic planner 228 to prepare wellbore plans without the assistance of the solver 330. For instance, if the generic planner 228 does not consider the impact of borehole conditions on wellbore plans, then the generic planner 228 may develop multiple versions of a particular plan or decision without a clear understanding of the impact on wellbore conditions. This may reduce the efficiency of the generic planner 228 and create any number of plans that would be ineffective to implement in a variety of environments.

The solver 230 may prepare a simulation of the operation based on physical conditions. For example, the solver 230 may include a model of borehole conditions. The solver 230 may include a physics-based simulation, or a simulation based on physical principles, such as the physical interaction of different elements of a borehole and drilling equipment, including material properties, material strengths, inertia, mass, density, any other physical properties, and combinations thereof. In some embodiments, the solver 230 may be programmed using a simulation language, or a programming language in which the solver 230 is programmed.

In accordance with at least one embodiment of the present disclosure, the solver 230 may perform the simulation based on information received by the generic planner 228. For example, the generic planner 228 may provide the solver 230 with state data of a particular wellbore plan. In some embodiments, the wellbore plan may be a projected plan for a future wellbore (e.g., a wellbore on which construction has not started) and the state data may be projected state data. In some embodiments, the wellbore plan may be a plan for a current wellbore (e.g., a wellbore on which construction has already started). In some embodiments, the state data provided to the solver 230 may be based on drilling conditions measured at the operation site 232.

As discussed herein, the generic planner 228 may be modelled using the planner language and the solver 230 may be programmed using the simulation language. The planner language and the simulation language may be different languages. In some situations, the planner language may not be designed to and/or may not be capable of performing the simulation.

In accordance with at least one embodiment of the present disclosure, the interface object 234 may include the planner outputs from the generic planner 228 and simulation inputs for the solver 230. An interface at the generic planner 228 may generate the interface object 234. In some embodiments, the interface may perform the conversions of inputs and outputs. In some embodiments, the interface object 234 may perform the conversions of inputs and outputs. For example, the interface object 234 may convert the planner outputs into format usable by the solver 230. Put another way, the interface object 234 may convert the planner outputs into simulation inputs. This may allow the solver 230 to prepare a borehole simulation based on the planner outputs, or based on state data provided by the generic planner 228.

In some embodiments, the generic planner 228 may be in communication with the solver 230 over a network 236. For example, the generic planner 228 may be in communication with the solver 230 over the Internet, a local area network (LAN), a wireless area network (WAN), a company or institution-based intranet, any other network, and combinations thereof. In some embodiments, the generic planner 228 and the solver 230 may be located on the same computing device. In some embodiments, the connection between the generic planner 228 and the solver 230 over the network 236 may be fast enough to support multiple queries in real time.

After the solver 230 prepares the simulation, the solver 230 may transmit the results of the simulation to the generic planner 228. For example, the solver 230 may transmit drilling information about the borehole based on the provided state data. In some embodiments, the interface object 234 may convert the simulation outputs into planner inputs for the generic planner 228.

As discussed herein, interactions between the generic planner 228, the solver 230, and the interface object 234 may be used to provide a generic way to interface planning with different solvers 230 and support utilization by the generic planner 228 of dynamic state-dependent external advice. A solver 230 may therefore be provided that satisfies the interface requirements (e.g., number and types of inputs), but the generic planner 228 can be used as a black box, and without customization to run the solver 230. As an example, in a borehole condition application, the inputs to the solver 230 can include the trigger variables (e.g., hole depth, which is increased by drilling, whether the pumps are on or off) and other variables (e.g., the pump rate, ROP, description of the deviated trajectory to be drilled). The output of the solver 230 can be a dynamic array of cells representing the borehole drilled so far, showing a simulated cuttings distribution. The interface object 234 can be given user-defined functions for evaluating local and global risk.

In some embodiments, the generic planner 228 and solver 230 operate in a pre-operational or pre-planning phase, which allows non-real-time application. Thus, the planning and simulation system 226 is not impeded by processing capabilities that may affect a real-time application. As an example, if a solver 230 is too slow or cumbersome to compute properties in real-time and therefore does not respond in an acceptable window of time, the solver 230 may not limit pre-planning activities. Thus, a more robust simulation can be done and the generic planner 228 can be used to call the solver 230 whenever the trigger variables are touched (or simulated as being touched), which might be hundreds or even thousands of times during an operation. In real-time, the solver 230 may still operate if it can do so efficiently. Therefore, the solver 230 may produce reasonably accurate predictions even with relatively little computational effort. For example, when evaluating cuttings accumulation in real time, a solver 230 could be used to operate in or near real-time by precomputing closures of the simulator models, although other strategies for overcoming complexity might also be effective.

It should be appreciated in view of the disclosure herein, that aspects of some embodiments are not limited to the specific implementations discussed, but are rather illustrative. For instance, the specific planning system used in the architecture could be replaced by any generic planner capable of reasoning with the same PDDL expressiveness as POPEX, METIS, etc. A solver 230 could be replaced by another simulator satisfying the interface requirements, or by a library which updates a fixed set of variables recorded in the planner's state. This could be used, for example, when the number of variables required is known in advance (e.g., when the depth to be drilled is known so that a fixed size array can be used to represent the borehole).

Aspects of the present disclosure enable a variety of features to be implemented that can replace and improve existing technologies. For instance, a borehole condition can presently be maintained by human operators following checklists comprising standard work instructions and procedures. These borehole checklists are necessarily finite in scope and therefore typically specify conservative schedules for activities like hole-cleaning. With an automated planner, significant numbers of additional scenarios can be evaluated and compared in real-time, to allow a more tailored balancing of cost and risk acceptable to a client.

Additionally, checklists leave considerable scope for human interpretation. Even if checklists are precise and followed exactly, the conservative schedules (such as cleaning every 5 stands) may be inefficient, resulting in unnecessary NPT, wasted energy to run the pumps, increased emissions, any other inefficiency result, and combinations thereof. Embodiments of the present disclosure can be used to dynamically generate precise sequences of activities (plans) to follow, which are capable of automated update during drilling. These can be automatically executed or used to generate checklists for humans to follow. The integration of a borehole condition simulator with a planner means that cleaning activities can be focused on parts of the borehole that are problematic according to the simulator. The generated plans can be more efficient and less likely to result in unwanted events than plans constructed by hand using conservative cleaning schedules.

Figures 1, 3:
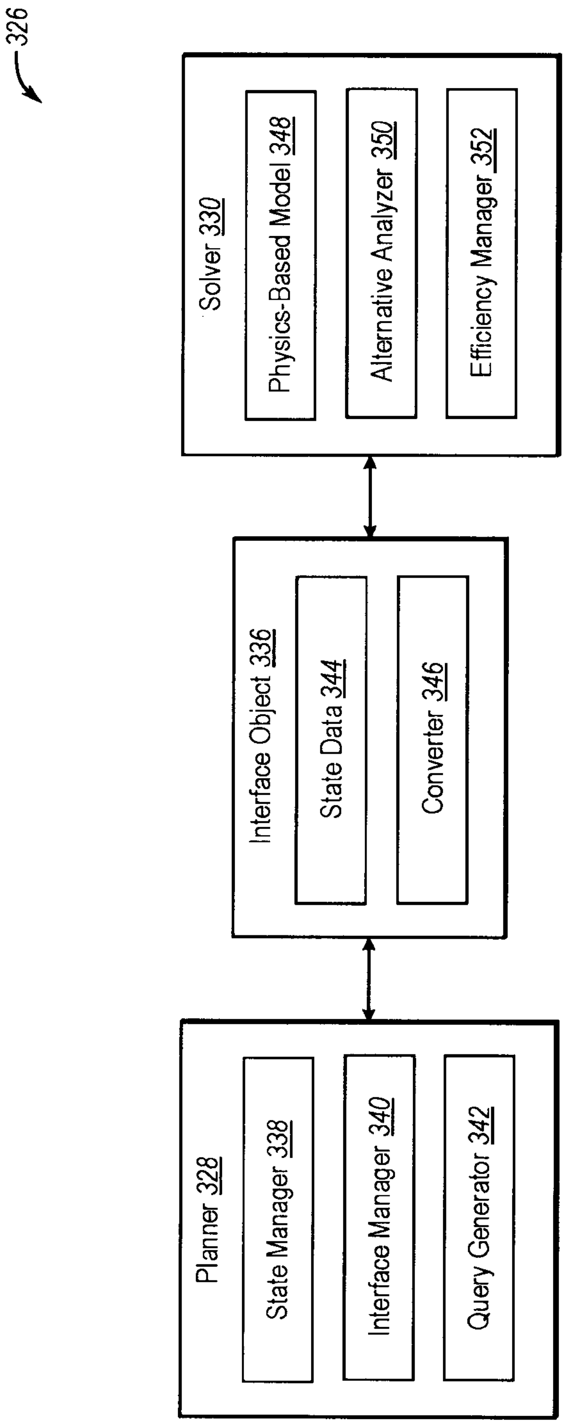
Figures 2, 3:
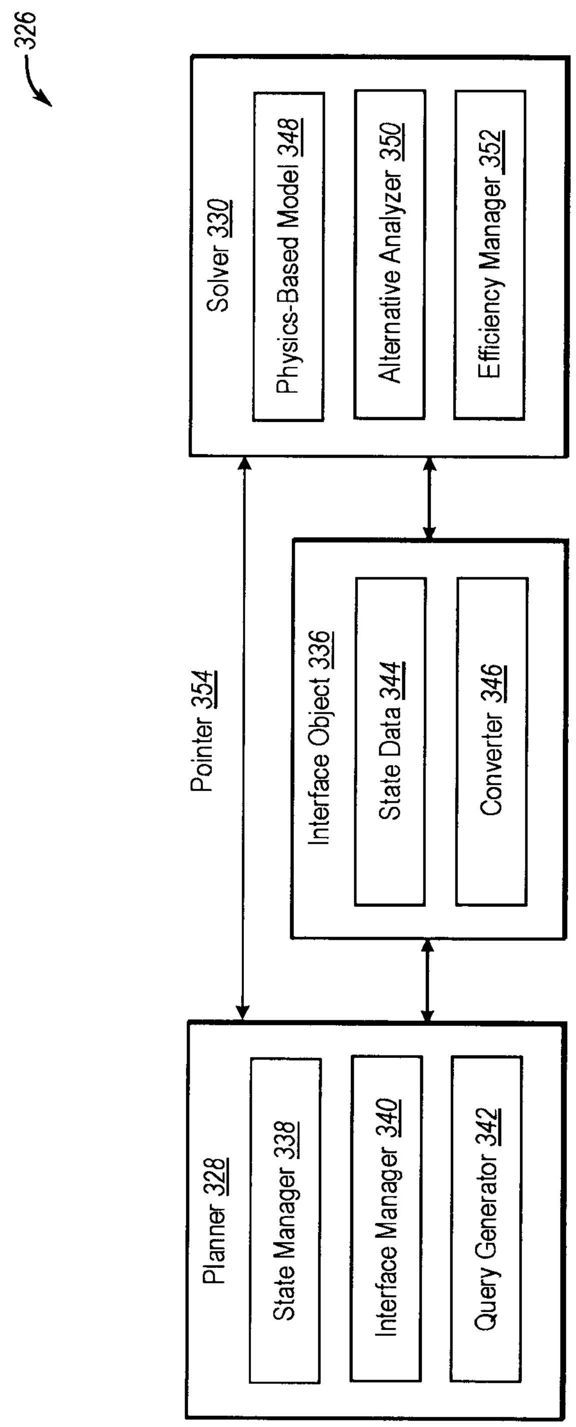

FIG. 3-1 is a representation of a planning and simulation system 326, according to at least one embodiment of the present disclosure. The planning and simulation system 326 includes a planner 328. The planner 328 may be in communication with a solver 330 via an interface object 336. The planner 328 may include a state manager 338. The state manager 338 may manage state information of the plan. For example, the state manager 338 may receive drilling parameters from the wellsite. In some embodiments, the state manager 338 may determine state data based on planned drilling conditions.

In accordance with at least one embodiment of the present disclosure, the interface object 336 may be formed by an interface that is a part of the planner 328. For example, the interface may be stored as part of the same program as the planner 328. In some embodiments, the interface object 336 may be formed by an interface that is executable separately from the planner 328. In some embodiments, the interface object 336 may be formed by a generic interface that may interface with any solver 330. In some embodiments, the interface object 336 may be customized for each solver 330. For example, a cuttings transport simulator may utilize different state data 344 than a borehole shape simulator. Each simulator may utilize an interface object 336 that is customized to prepare the appropriate the state data 344. In some embodiments, the interface object 336 may be customized to the solver 330. In some embodiments, the solver 330 may be modified to accommodate the interface object 336.

In some embodiments, the planner 328 may include an interface manager 340 and a query generator 342. In some embodiments, the planner 328 may identify one or more triggers or trigger conditions. A trigger condition may be an event, variable, or other element of a plan and/or measured or received physical condition that may result in the planner 328 requesting a borehole simulation from the solver 330. When a trigger condition has occurred (e.g., when a trigger condition has been identified or measured), the query generator 342 may generate a query for the solver 330. For example, the query generator 342 may generate a query that requests a result of a borehole simulation from the solver 330.

The interface manager 340 may populate the interface object 336 with state data 344. In some embodiments, the interface manager 340 may provide the interface object 336 with the state data 344 identified by the state manager 338. As discussed herein, in some embodiments, the solver 330 may not be able to utilize the information provided by the planner 328. A converter 346 on the interface object 336 may convert the state data 344 provided by the planner 328 into state data usable by the solver 330.

The solver 330 may receive the state data 344. Using a model, such as a physics-based model 348, the solver 330 may prepare a simulation. For example, the physics-based model 348 may include a borehole simulation based on the query generated by the query generator 342.

For example, consider a wellbore plan that includes the state data 344 of a particular WOB, drilling fluid flow, and RPM. The query generator 342 may generate a query that asks whether the wellsite may drill for four hours using this state data 344. The physics-based model may perform a borehole simulation using the provided state data 344 to respond to the query. The solver 330 may provide the interface object 336 with the response to the query based on the borehole simulation. For example, the solver 330 may provide the planner 328 with a solution regarding whether the wellsite may drill for four hours using the state data 344. In some embodiments, the solver 330 may provide the planner 328 the response or answer to the query through the interface object 336. In some embodiments, the converter 346 may convert the response to the query into state data 344 that is readable by the planner 328. In this manner, the planner 328 may determine how a particular plan may impact borehole conditions.

In accordance with at least one embodiment of the present disclosure, the solver 330 may analyze recommended operations provided by the planner 328. The recommended operation may include a recommended change in drilling parameters, a recommended change in equipment, any other recommended course of action, and combinations thereof. In some embodiments, the recommended operation may be recommended to improve or maintain borehole conditions in the wellbore. For example, the recommended operation from a cuttings transport model may be directed toward maintaining a clean borehole, or a borehole that is not clogged with cuttings. In some examples, the recommended operation from a borehole trajectory model may include a recommended adjustment to WOB to reduce the tortuosity of the wellbore. In some examples, the recommended operation may include any recommended operation to improve or maintain borehole conditions.

In some embodiments, the wellsite may perform the one or more recommended operations. For example, the planner 328 may operate in real-time and provide planning details for drilling a wellbore. When the planner 328 receives an analysis of the recommended operations by the solver 330, the planner 328 may prepare instructions for equipment at the wellsite to adjust drilling parameters or perform another operation. In this manner, the planner 328 may perform automated drilling, including adjustment to borehole conditions based on borehole simulations.

In accordance with at least one embodiment of the present disclosure, the solver 330 may include an alternative analyzer 350. The alternative analyzer 350 may analyze alternative responses to the query. For example, using the query from the example above, the physics-based model 348 may determine that the wellsite may not drill for four hours because the cuttings may clog in the borehole. The alternative analyzer 350 may identify one or more alternative responses to the query. For example, the alternative analyzer 350 may provide a length of time that the wellsite may drill before clogging the borehole. In some examples, the alternative analyzer 350 may provide adjusted drilling parameters that allow the wellsite to drill for four hours. In this manner, the alternative analyzer 350 may provide an alternative borehole simulation (potentially including alternative state data 344) to the planner 328. This may allow the planner 328 to reduce the amount of total alternative wellbore plans generated, thereby improving the efficiency of operation of the planner 328.

In some embodiments, the solver 330 may include an efficiency manager 352. The efficiency manager 352 may determine with how much detail the physics-based model 348 may prepare the simulation. As discussed herein, the planner 328 may operate in real-time with the operation site. Preparing a full simulation each time a query is generated may bog down the planning and simulation system 326, reducing the responsiveness of the wellbore plan. In accordance with at least one embodiment of the present disclosure the efficiency manager 352 may adjust the level of detail of the physics-based model 348. For example, to reduce the processing speed of the solver 330, the efficiency manager 352 may reduce the number of updated variables considered by the physics-based model 348. In some embodiments, some variables may not change between simulations, thereby reducing the number of calculations based on those variables. In some embodiments, the efficiency manager 352 may reduce the accuracy of the simulation to improve processing time.

In FIG. 3-2, the planner 328 may communicate directly with the solver 330, facilitated by the interface object 336. For example, the state data 344 may include one or more pointers 354. The one or more pointers 354 may include storage locations within the planner 328 and/or the solver 330 of variables of interest. For example, the interface object 336 may provide the query to the solver 330. Using the pointers 354, the solver 330 may request and/or retrieve the drilling parameters from the planner 328. In some embodiments, the interface object 336 may indicate to the planner 328 that the simulation is completed, and, using the pointers 354, the planner 328 may request and/or retrieve the results of the simulation and/or the response to the query from the solver 330.

Figures 1, 4:
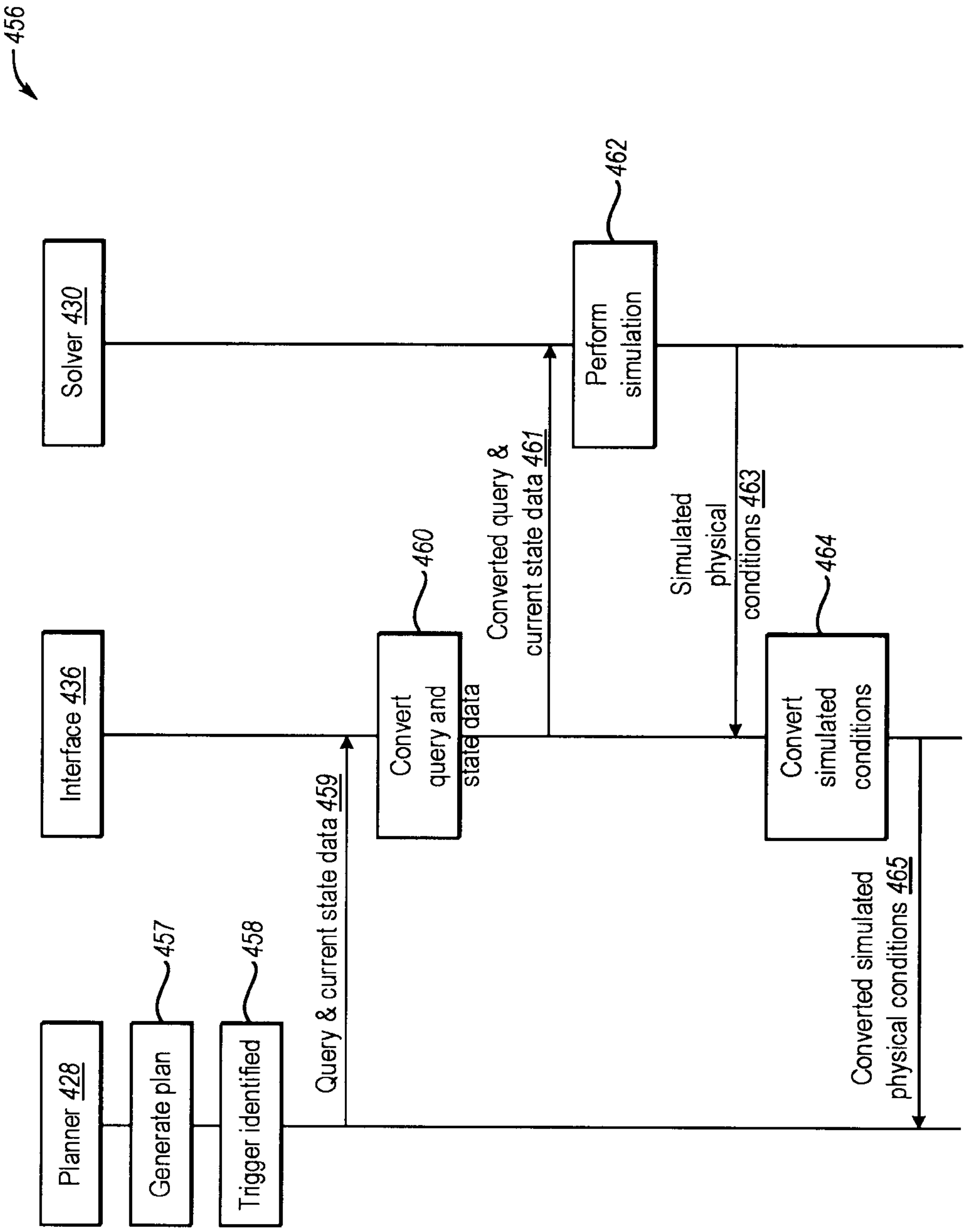
Figures 2, 4:
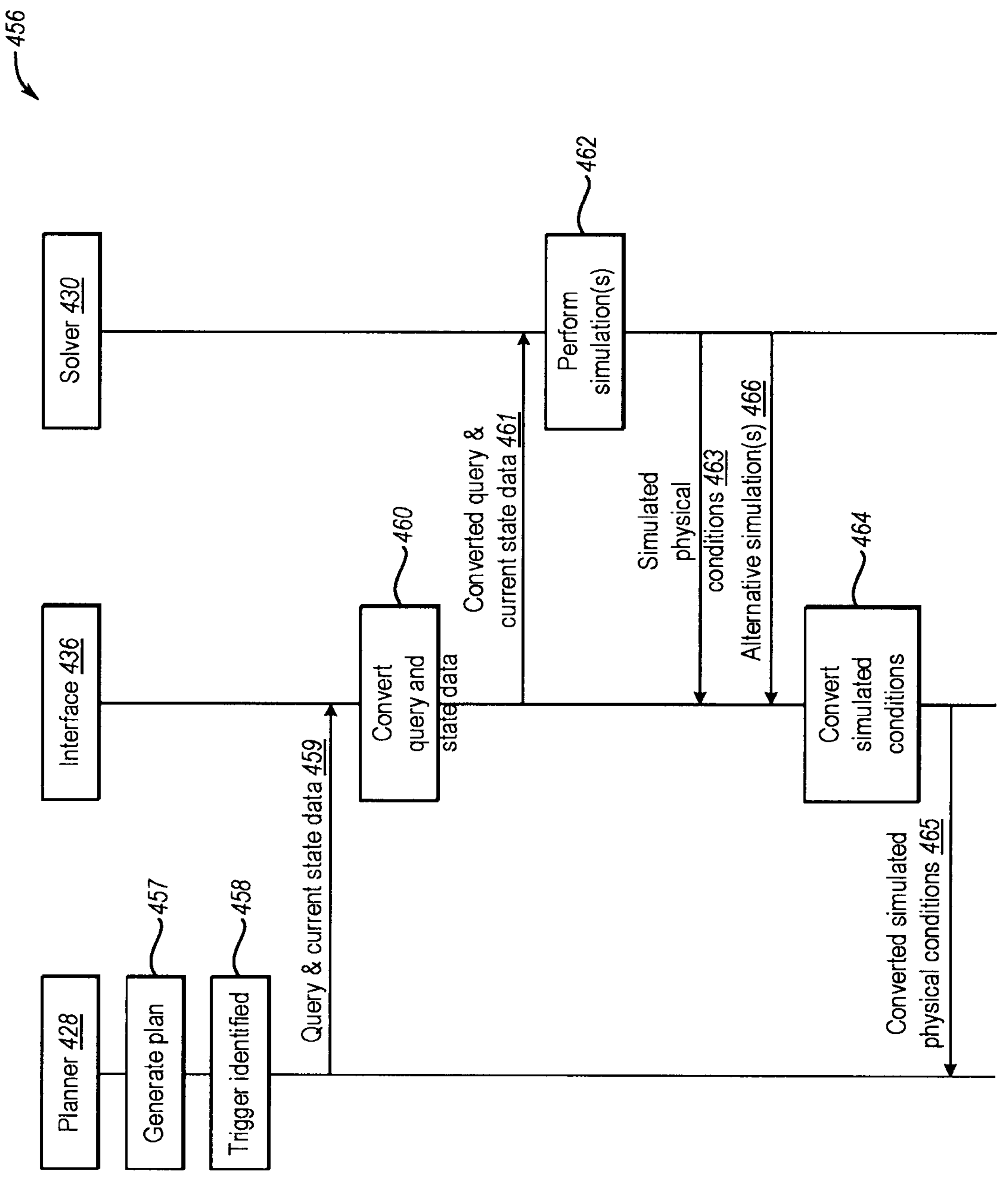

FIG. 4-1 is a representation of a planning diagram 456 for a planning and simulation system, according to at least one embodiment of the present disclosure. As discussed herein, the planning and simulation system includes a planner 428 and a solver 430 in communication through an interface 436. As discussed herein, the interface 436 may be a part of the planner 428. In some embodiments, the interface 436 may be part of the solver 430. In some embodiments, the interface 436 may be spread across the planner 428 and the solver 430.

The planner 428 may generate a wellbore plan at 457. While generating the plan, the planner 428 may identify a trigger at 458. For example, the planner 428 may identify that one or more trigger conditions have been satisfied. In some embodiments, the trigger condition may be identified based on measurements or other conditions identified by the wellsite. In some embodiments, the trigger condition may be identified based on simulated plan conditions. In some embodiments, the trigger condition may be any type of trigger condition, such as borehole depth, borehole trajectory, a drilling parameter value, a penetration rate, intersection with a formation or rock type, any other trigger condition, and combinations thereof.

After the trigger is identified, the planner 428 may send a query and current state data 459 to the interface 436. As discussed herein, the current state data may include any state data, such as one or more drilling parameters, borehole depth, borehole trajectory, equipment type, formation type, any other state data, and combinations thereof. The interface 436 may convert the query and state data into a format usable by the solver 430 at 460. The interface 436 may then send the converted query and state data 461 to the solver 430. In some embodiments, the interface 436 may send the state data 461 to the solver 430 through an interface object or packet.

The solver 430 may perform the simulation at 462. The simulation may generate simulated physical conditions 463, based on the current state data. The solver 430 may send the simulated physical conditions to the interface 436. In some embodiments, the interface 436 may convert the simulated physical conditions into a format usable by the planner 428 at 464. The interface 436 may send the converted simulated physical conditions 465 to the planner 428. In this manner, the planner 428 may request and receive a physical simulation from the solver 430.

In some embodiments, the solver 430 may review one or more recommended operations for equipment to perform. For example, when the solver 430 prepares the simulation, the solver 430 may determine whether the recommended operations provided by the planner 428, if implemented by the equipment, may improve or maintain physical conditions. In some embodiments, the recommended operations may be related to the physics-based model. As an example, the recommended operations may be related to the borehole conditions simulated by the solver 430. In some embodiments, when the planner 428 receives the analysis of the recommended operations (which may be converted into a format usable by the planner 428 by the interface 436), the planner 428 may instruct the wellsite to perform the recommended operations. This may help to improve the operation of the wellsite by developing a plan incorporating the simulation of the borehole condition simulator.

As may be seen in FIG. 4-2, and as discussed herein, in some embodiments, the solver 430 may generate one or more alternative simulations 466. The alternative simulations 466 may include alternative analyses of the query and current state data. For example, the alternative simulations 466 may identify one or more alternative timeframes, alternative drilling parameters, or other alternative response to the query and/or simulation based on the current state data. The interface 436 may convert the alternative simulations into a format usable by the planner 428 and send the converted simulations to the planner 428. In this manner, the solver 430 may provide the planner 428 with multiple simulations, thereby allowing the planner 428 to develop a more robust wellbore plan.

Figure 5:
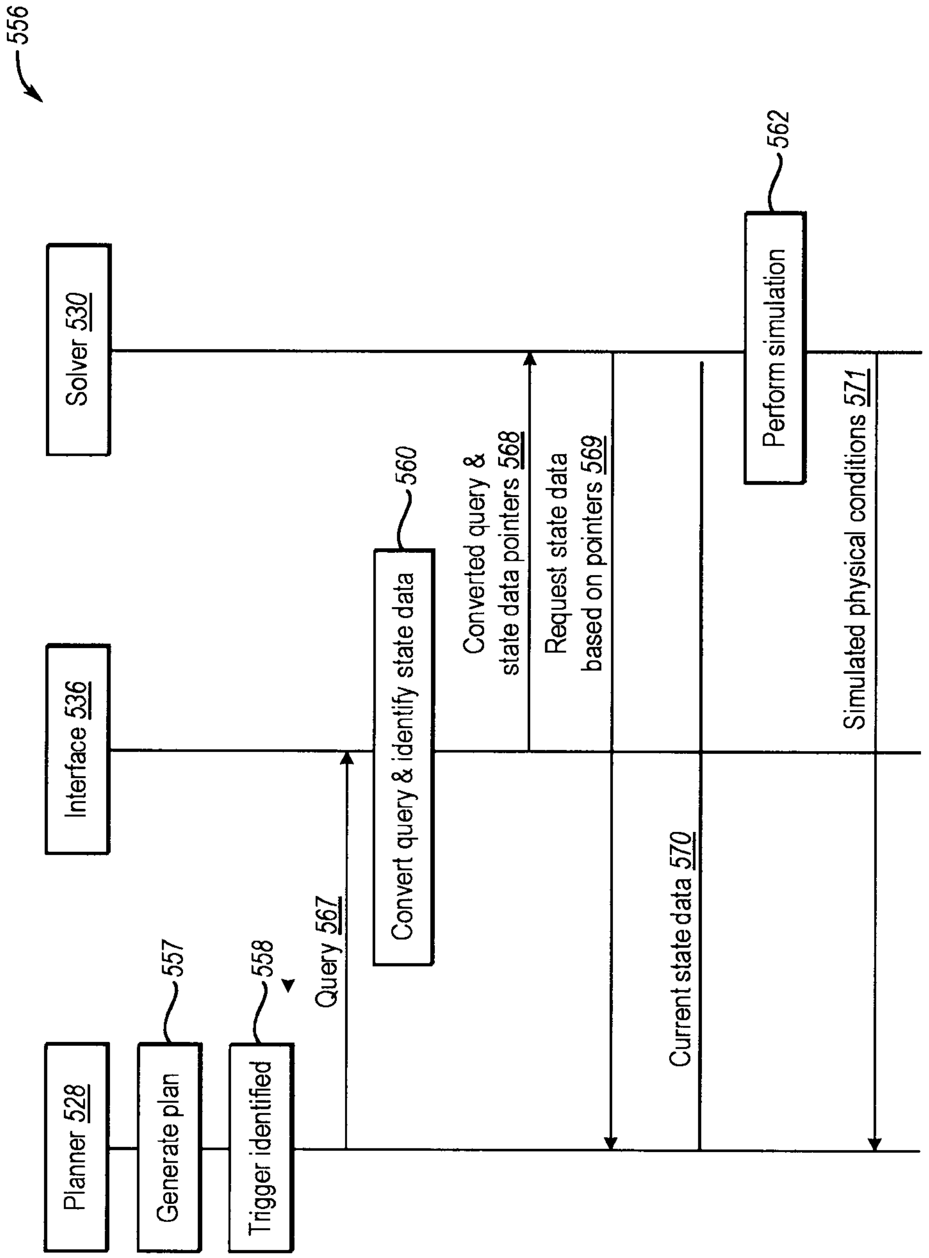
FIG. 5 is a representation of a planning diagram for a wellbore planning and simulation system, according to at least one embodiment of the present disclosure.

FIG. 5 is a representation of a planning diagram 556 for a planning and simulation system, according to at least one embodiment of the present disclosure. As discussed herein, the planning and simulation system includes a planner 528 and a solver 530 in communication through an interface 536. The planner 528 may generate a plan at 557. While generating the plan, the planner 528 may identify a trigger at 558. For example, the planner 528 may identify that one or more trigger conditions had been satisfied.

After the trigger is identified, the planner 528 may send a query 567 to the interface 436. The interface 536 may identify convert the query into a format usable by the solver 530 at 560. In some embodiments, the interface 536 may identify where state data is stored in the planner 528. For example, the interface 536 may generate one or more pointers that point to the storage location for the current state data for the planner 528. In some embodiments, the interface 536 may send the converted query and state data pointers 568 to the solver 530.

The solver 530, upon receipt of the query and state data pointers 568 may request state data directly from the planner 528. For example, the solver 530 may send a request 569 to the planner 528 that includes the pointers to the state data and the planner 528 may send the current state data 570 to the solver 530.

The solver 530 may perform the simulation at 562. The simulation may generate simulated conditions 571, based on the current state data. The solver 530 may send the simulated conditions directly to the planner 528. In this manner, the planner 528 may request and receive a simulation from the solver 530.

Figure 6:
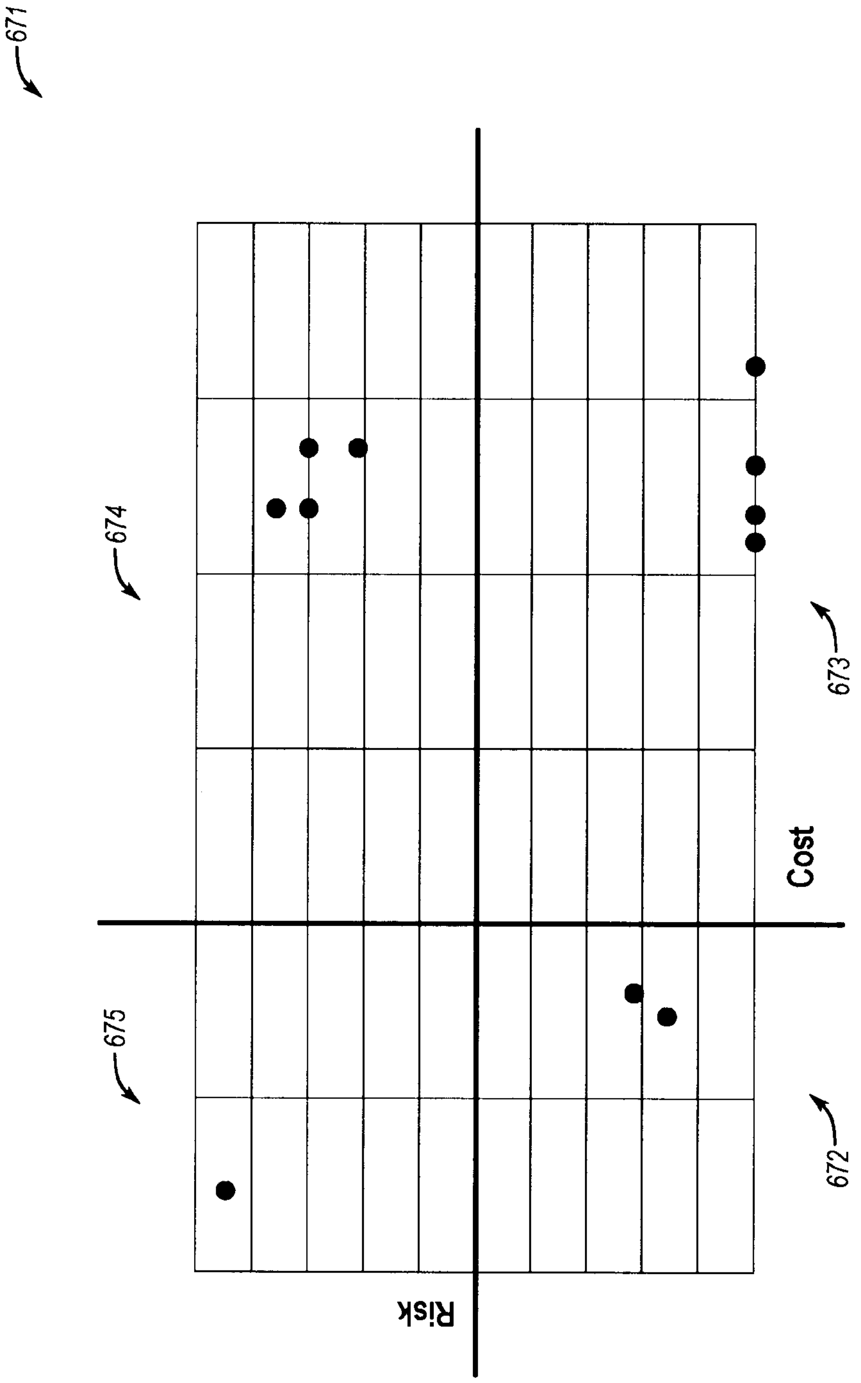
FIG. 6 is a plot of multiple plans determined when evaluating cost and risk of various plans, according to at least one embodiment of the present disclosure.

Using methods of the present disclosure, a space of alternative plans can be generated and evaluated according to different metrics. FIG. 6, for instance, is a cost vs. risk plot 671 of a wellbore plan generated using methods described herein, and considers a variety of plans on a two-dimensional plot that considers risk of events against the cost of the plan. As may be seen, the cost vs. risk plot 671 shows risk plotted on the vertical axis (e.g., the y-axis) and cost plotted on the horizontal axis (e.g., the x-axis). The cost vs. risk plot 671 includes a plurality of simulation points, each simulation point being representative of a particular set of state data, including drilling parameters, time spent drilling with the drilling fluid parameters, results from the simulation, any other state data, and combinations thereof.

The cost vs. risk plot 671 may be generally separated into four categories based on the cost and risk of the drilling simulation. Drilling simulations in a first category 672 have a low cost and a low risk. Drilling simulations in a second category 673 have a low risk and a high cost. Drilling simulations in a third category 674 have a high risk and a high cost, and drilling simulations in a fourth category 675 have a high risk and a low cost.

After calculating the cost and risk on the cost vs. risk plot 671 for a particular set of state data based on the simulation, the drilling operator may determine which set of state data to implement in a drilling activity. In some embodiments, the wellbore planner may determine which set of state data to use based on the cost vs. risk plot 671. In some embodiments, the wellbore planner may prioritize low-risk options, resulting in selections from the first category 672 and/or the second category 673. In some embodiments, the wellbore planner may prioritize low-cost options, resulting in selections from the first category 672 and/or fourth category 675. In some embodiments, the wellbore planner may only select options from the first category 672. In this manner, the wellbore planner may determine which set of state data to implement in the wellbore plan based on a risk analysis of the simulations provided by the borehole condition simulator. In other embodiments, multiple additional dimensions may also be considered (e.g., likelihood of having suitable equipment available, time, etc.). This may result in a commensurate increase in the number of considerations utilized in the risk trade-off analysis.

In experiments conducted using a borehole condition simulator connected to a POPEX planner according to embodiments of the present disclosure, a large number of 50-stand problems was constructed in a deviated borehole, with different pump rates and ROPs. POPEX was run in 3 configurations, namely: (i) Null (simulator is ignored); (ii) Fixed (simulator is ignored and a fixed cleaning schedule is followed); and (iii) planned (simulator is engaged). Data was collected on the simulated cuttings behavior during planning for large numbers of problems in each of these configurations. Plotting this data allowed visualization of the simulated cuttings behavior over plans in each of the configurations, and evaluation of the global risk and cost of the resulting plans for placement on a risk-cost graph for comparison against these metrics. Experimental results showed the planner could achieve a better risk-cost trade-off when using the borehole condition simulator than when either not cleaning or cleaning according to a fixed schedule.

Figure 7:
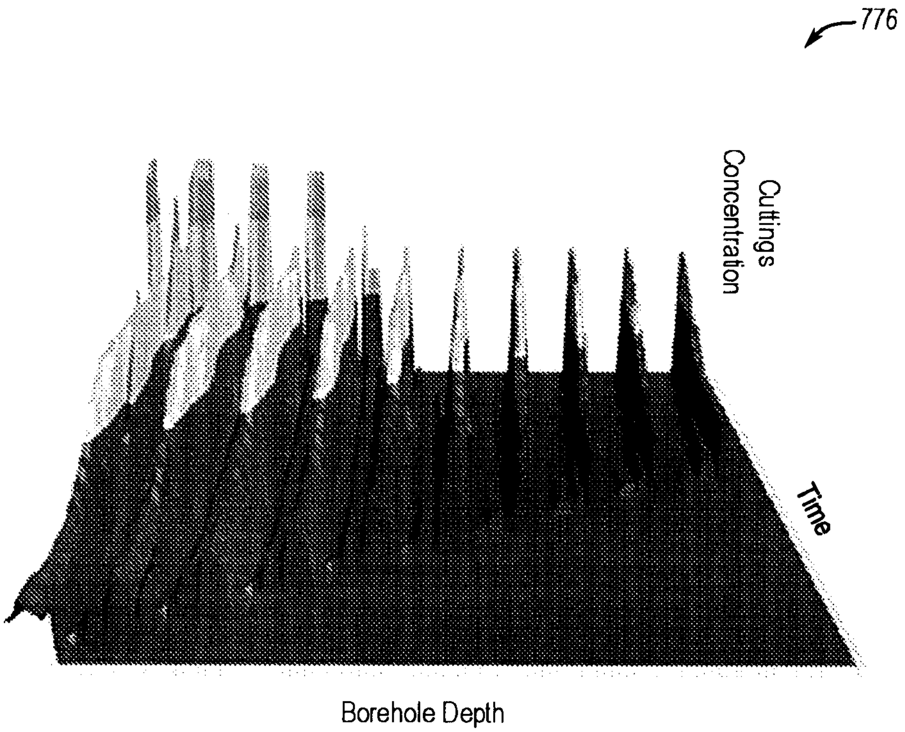
FIG. 7 is a plot of cuttings accumulation in a wellbore based on a fixed cleaning schedule.
Figure 8:
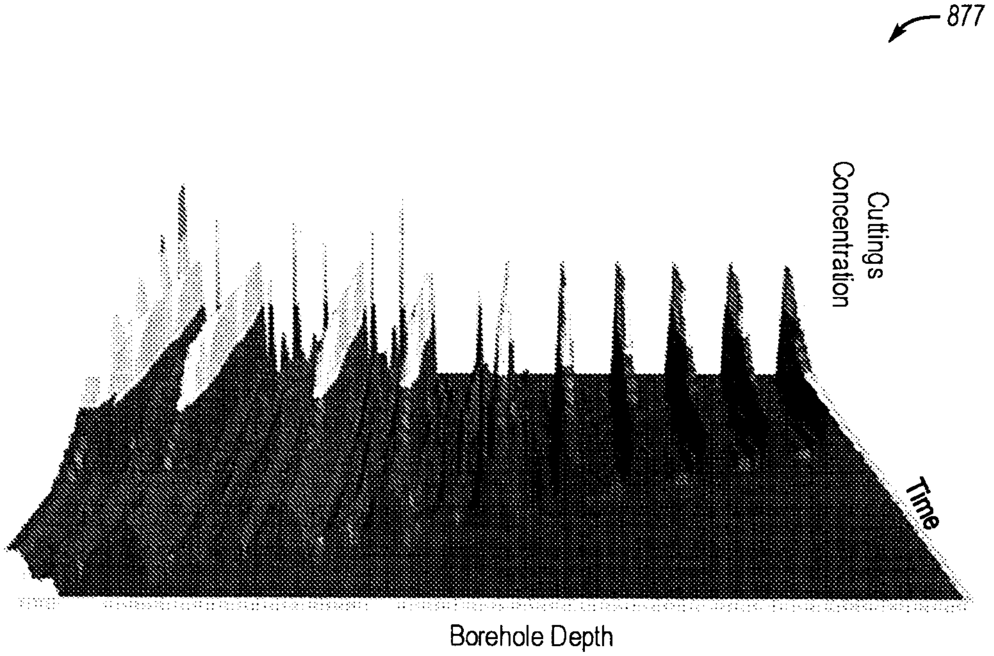
FIG. 8 is a plot of cuttings accumulation in a wellbore based on a planned cleaning schedule.

Preliminary results from the evaluation of the experiment show that planned cleaning results in lower cuttings concentration throughout the borehole (i.e., the borehole is maintained in a cleaner condition) than when a fixed policy is used. For example, FIG. 7 is a representation of a scheduled-cleaning cuttings concentration plot 776 and FIG. 8 is a representation of a planned-cleaning cuttings concentration plot 877 over time, with cuttings concentration shown on the vertical axis (e.g., the z-axis), borehole depth shown on the horizontal axis (e.g., the x-axis), and time shown on the axis into the page (e.g., the y-axis). In the scheduled-cleaning cuttings concentration plot 776 of FIG. 7, the borehole is cleaned on a fixed cleaning schedule. In the planned-cleaning cuttings concentration plot 877 FIG. 8, the borehole is cleaned based on a wellbore planning and simulation as described herein.

Figure 9:
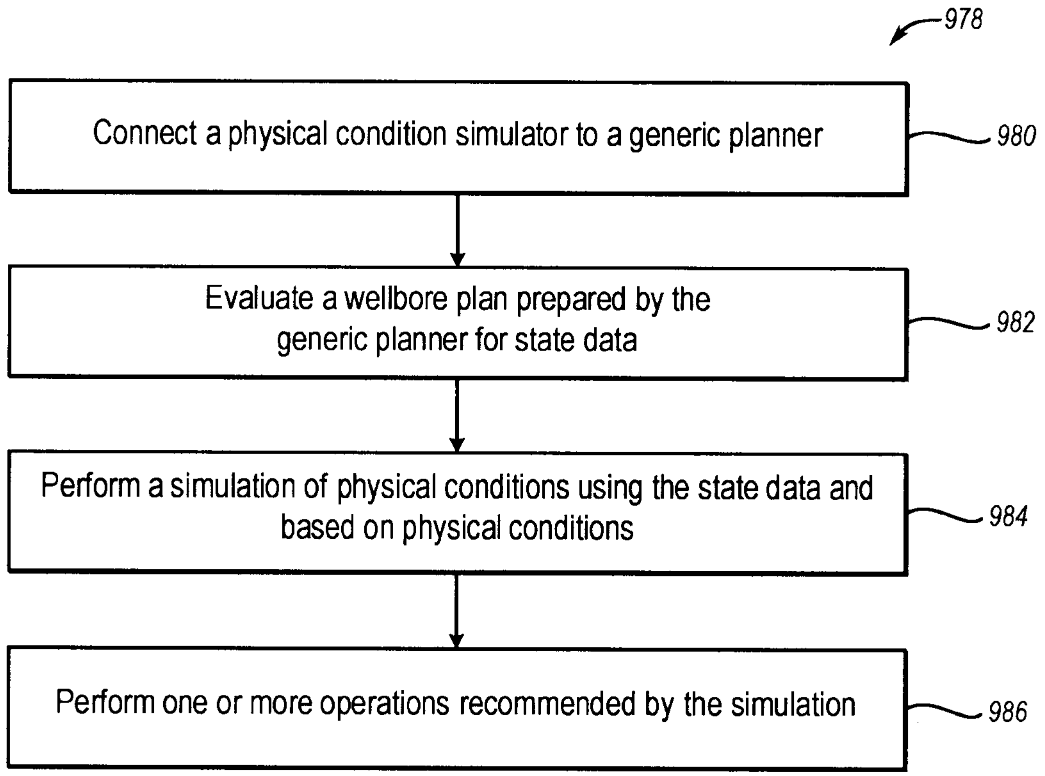
FIG. 9 is a flowchart of a method for wellbore planning and simulation, according to at least one embodiment of the present disclosure.
Figure 10:
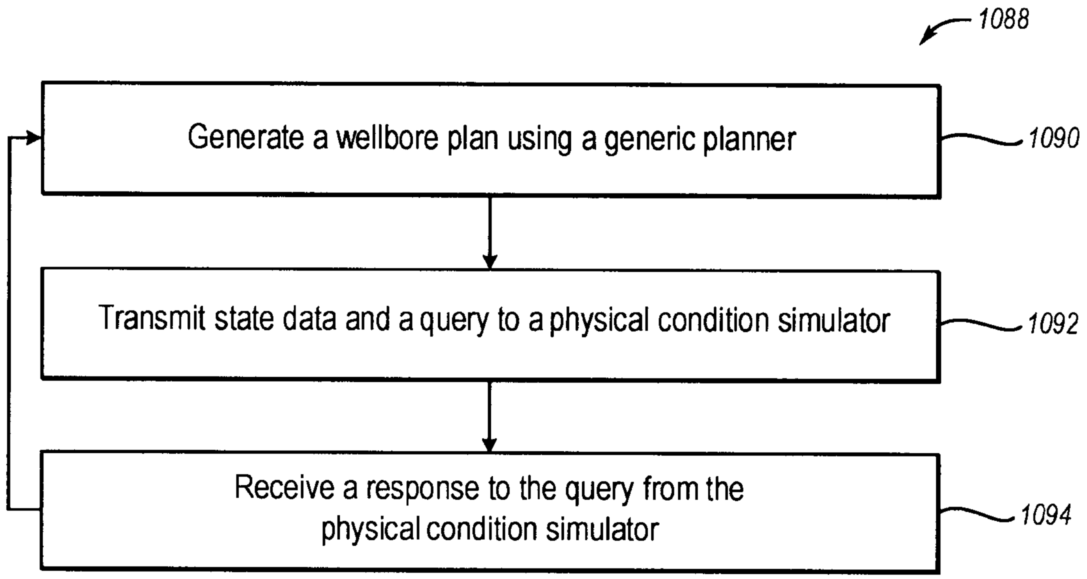
FIG. 10 is a flowchart of a method for wellbore planning and simulation, according to at least one embodiment of the present disclosure.

The cuttings concentration represents the percentage of the borehole volume that is clogged by cuttings. It can be seen that, using the fixed schedule policy shown in FIG. 7, the cuttings concentration in the deviated part of the wellbore regularly reach 25%, while in the planned cleaning case shown in FIG. 8 the cuttings concentration stays at around 15%. This shows that the global risk associated with the fixed policy is significantly higher than that associated with planned cleaning FIGS. 9 and 10, the corresponding text, and the examples provide a number of different methods, systems, devices, and non-transitory computer-readable media of the wellbore planning and simulation. In addition to the foregoing, one or more embodiments can also be described in terms of flowcharts comprising acts for accomplishing a particular result, as shown in FIGS. 9 and 10 may be performed with more or fewer acts. Further, the acts may be performed in differing orders. Additionally, the acts described herein may be repeated or performed in parallel with one another or parallel with different instances of the same or similar acts.

As mentioned, FIG. 9 illustrates a flowchart of a series of acts for generating wellbore plans, in accordance with one or more embodiments. While FIG. 9 illustrates acts according to one embodiment, alternative embodiments may omit, add to, reorder, and/or modify any of the acts shown in FIG. 9. The acts of FIG. 9 can be performed as part of a method 978. Alternatively, a computer-readable medium can comprise instructions that, when executed by one or more processors, cause a computing device to perform the acts of FIG. 9. In some embodiments, a system can perform the acts of FIG. 9.

The wellbore planning and simulation system may connect a borehole condition simulator to a generic planner at 980. As discussed herein, the generic planner may not be designed to specifically consider borehole conditions. In some embodiments, the wellbore planning and simulation system may evaluate a wellbore plan prepared by the generic planner for state data at 982. The state data may include one or more drilling parameters.

The borehole condition simulator may perform a simulation of borehole conditions using the state data and based on the borehole conditions at 984. The simulation may determine one or more recommended operations that may improve or maintain the borehole conditions during a drilling operation. In some embodiments, a wellsite may perform the one or more recommended operations at 986.

In some embodiments, the simulation may include a physics-based model. In some embodiments, the simulation using the physics-based model may provide an approximation of borehole conditions that is sufficient to improve the efficiency and safety of well construction operation. In some embodiments, the one or more recommended operations are less conservative than a schedule of cleaning operations for a wellbore. For example, in the experimental results described above, the recommended planned cleaning schedule may be less conservative than the fixed-schedule schedule of cleaning operations. This may result in longer delays between cleaning operations, especially in straight sections of the borehole.

In some embodiments, and as discussed herein, during the simulation, the borehole condition simulator may evaluate a plurality of operations. For example, the borehole condition simulator may evaluate a plurality of alternative operations and/or state data (including drilling parameters) than requested in the query. In some embodiments, evaluating the different operations may include evaluating trade-offs of risk against cost, as described, for example, with respect to FIG. 6.

As mentioned, FIG. 10 illustrates a flowchart of a series of acts for generating a wellbore plan without considering borehole conditions, in accordance with one or more embodiments. While FIG. 10 illustrates acts according to one embodiment, alternative embodiments may omit, add to, reorder, and/or modify any of the acts shown in FIG. 10. The acts of FIG. 10 can be performed as part of a method 1088. Alternatively, a computer-readable medium can comprise instructions that, when executed by one or more processors, cause a computing device to perform the acts of FIG. 10. In some embodiments, a system can perform the acts of FIG. 10.

The wellbore planning and simulation system may generate a generic wellbore plan using a generic wellbore planner at 1090. The generic planner may generate state data. In some embodiments, the generic planner may generate a query for borehole conditions based on the state data. In some embodiments, the generic planner may transmit the state data and the query to a borehole condition simulator at 1092. In some embodiments, the borehole condition simulator may be configured to generate a borehole simulation using the state data. In some embodiments, the generic planner may receive a response to the query from the borehole condition simulator at 1094. In some embodiments, the response may be based on the borehole simulation in view of the state data provided to the borehole condition simulator.

As discussed herein, a planner language of the generic planner may be different from a simulation language of the borehole condition planner. This may result in the generic planner not being capable of performing the borehole simulation.

In some embodiments, the generic planner may identify a trigger condition satisfied by the wellbore plan and/or wellsite data. In some embodiments, transmitting the state data and the query is based on the trigger condition being satisfied by the wellbore plan. For example, the trigger condition may be any trigger condition described herein, such as a particular drilling condition value, a borehole depth, a borehole trajectory, any measured borehole conditions, any other trigger condition, and combinations thereof. In some embodiments, identifying the trigger condition includes identifying the trigger condition from measurements received from the wellbore.

In some embodiments, when transmitting the state data and/or the query, the generic planner may prepare an interface object, as discussed herein. In some embodiments, the interface object may include the state data used by the borehole condition simulator and the query. In some embodiments, when the generic planner prepares the interface object, the interface object and/or the generic planner may convert the state data and/or the query into a data format usable by the borehole condition simulator. In some embodiments, the interface object may be prepared based on the identification of a trigger condition. In some embodiments, the query may be based on the trigger condition. In some embodiments, the interface object is prepared based on a measured state of the wellbore being drilled.

In accordance with at least one embodiment of the present disclosure, the wellbore plan and the borehole simulation may be based on persistent state data. For example, when the wellbore plan receives the response to the query, including updated state information and/or recommended operations, the wellbore plan may be updated with the response to the query. In some embodiments, the wellbore plan then generate a revised wellbore plan using the response to the query. For ease of reference, this may result in the interface object being a first interface object, the state data being first state data, and the response being a first response. The generic planner, after receiving the first response, may prepare a second interface object including a second query and second state data. The generic planner may transmit the second interface object to the borehole conditions simulator and receive a second response to the query. The second response may be based on the second state data. In this manner, the wellbore planning and simulation system may be iterative based on persistent state data passed between the generic planner and the borehole condition simulator.

In some embodiments, the persistent state data may be based on state data at least partially measured from wellsite conditions. For example, after receiving the response, the wellbore planner may receive updated wellsite conditions, such as updated measurements regarding drilling parameters or other wellsite conditions. The wellbore planner may update the plan (or generate a new plan) based on the updated wellsite conditions. For example, the new plan generated would have initial state conditions based on the updated wellsite conditions. In some embodiments, the wellbore planner may prepare a second query based on the updated wellsite conditions and send the second query to the borehole condition simulator.

In some embodiments, the persistent state data may be based on recommended operations recommended by the borehole condition simulator in the response to the query. For example, the generic planner may receive the recommended operations and instruct the wellsite to implement the recommended operations. This may result in a change in the planned and/or measured state data of the wellsite. The generic planner may send the new state data to the borehole condition simulator, and the borehole condition simulator may prepare a revised response to the query. In this manner, the state data may persist and evolve over the life of the wellbore plan and/or the life of the wellbore.

One or more specific embodiments of the present disclosure are described above and are only examples of the presently disclosed techniques. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. The term "and/or" is both disjunctive and conjunctive. Accordingly, a phrase such as "A, B, and/or C" includes A, B, C, A and B, A and C, B and C, and A, B, and C.

As used herein, the terms "connect," "connection," "connected," "in connection with," and "connecting" are used to mean "in direct connection with" or "in connection with via one or more elements"; and the term "set" is used to mean "one element" or "more than one element." Further, the terms "couple," "coupling," "coupled," "coupled together," and "coupled with" are used to mean "directly coupled together" or "coupled together via one or more elements." As used herein, the terms "up" and "down," "uphole" and "downhole", "upper" and "lower," "top" and "bottom," and other like terms indicating relative positions to a given point or element are utilized to more clearly describe some elements. Commonly, these terms relate to a reference point as the surface from which drilling operations are initiated as being the top (e.g., uphole or upper) point and the total depth along the drilling axis being the lowest (e.g., downhole or lower) point, whether the well (e.g., wellbore, borehole) is vertical, horizontal or slanted relative to the surface.

In addition, as used herein, the terms “real time”, “real-time”, or “substantially real time” may be used interchangeably and are intended to described operations (e.g., computing operations) that are performed without any human-perceivable interruption between operations. For example, as used herein, data relating to the systems described herein may be collected, transmitted, and/or used in control computations in “substantially real time” such that data readings, data transfers, and/or data processing steps occur once every second, once every 0.1 second, once every 0.01 second, or even more frequently, during operations of the systems (e.g., while the systems are operating). In addition, as used herein, the terms “automatic” and “automated” are intended to describe operations that are performed are caused to be performed, for example, by a processing system (i.e., solely by the processing system, without human intervention).

The embodiments described herein generally include systems and methods that facilitate operation of well-related tools. In certain embodiments, a variety of data (e.g., downhole data and/or surface data) may be collected to enable optimization and evaluation of operations related to the well-related tools. In certain embodiments, the collected data may be provided as advisory data (e.g., presented to human operators of the well to inform control actions performed by the human operators) and/or used to facilitate automation of downhole processes and/or surface processes (e.g., which may be automatically performed by a computer implemented surface processing system (e.g., a well control system), without intervention from human operators). In certain embodiments, the systems and methods described herein may enhance downhole operations by improving the efficiency and utilization of data to enable performance optimization and improved resource controls of the downhole operations. In certain embodiments, a downhole well tool may be deployed downhole into a wellbore via a drill string, or may include drill mud pumped into the wellbore. In certain embodiments, the systems and methods described herein may be used for displaying or otherwise outputting desired (e.g., optimal) actions to human operators so as to enable improved decision-making regarding operation of the well tool (e.g., operation of a downhole or surface system/device).

In certain embodiments, downhole parameters are obtained via, for example, downhole sensors while the downhole well tool is in the wellbore. In certain embodiments, the downhole parameters may be obtained by the downhole sensors in substantially real time (e.g., as the downhole data is detected while the downhole well tool is being operated), and sent to the surface processing system (or other suitable processing system) via wired or wireless telemetry. The downhole parameters may be combined with surface parameters. In certain embodiments, the downhole and/or surface parameters may be processed during operation of the well tool downhole to enable automatic optimization (e.g., by the surface processing system, without human intervention) with respect to the operation of the well tool during subsequent stages of well tool operation. In some embodiments, downhole parameters are obtained by surface or uphole sensors using inversion techniques.

In some embodiments, the methods of the present disclosure may be executed by a computing system. For instance, a computing system may include a computer or computer system that is an individual computer system or an arrangement of distributed computer systems. The computer system can include one or more analysis modules that are configured to perform various tasks according to some embodiments, such as one or more methods disclosed herein. Example modules or computing systems may be in the form of special-purpose downhole tools (e.g., sensor packages), or surface equipment. To perform these various tasks, the analysis module executes independently, or in coordination with, one or more processors, which are connected to one or more computer-readable media. The processors are optionally connected to a network interface to allow the computer system to communicate over a data network with one or more additional computer systems and/or cloud computing systems that may or may not share the same architecture, and may be located in different physical locations. For instance, one computer system may be located in downhole equipment, an alternative or additional computer system may be on a rig or wellbore surface, another may be in a maintenance/repair/mixing facility, another may be in a cloud-computing facility or data center, and any may be located in varying countries on different continents.

A processor may include a microprocessor, microcontroller, processor module or subsystem, programmable integrated circuit, programmable gate array, or another control or computing device. Additionally, while computer-readable media may be within a computer system, in some embodiments, computer-readable media may be distributed within and/or across multiple internal and/or external enclosures of a computing system and/or additional computing systems. The computer-readable media may be implemented as one or more computer-readable or machine-readable storage media, transmission media, or a combination of storage and transmission media.

As used herein, “storage media”, “computer-readable storage media,” and the like refer to physical media that stores software instructions in the form of computer-readable program code that allows performance of embodiments of the present disclosure. “Transmission media”, “computer-readable transmission media,” and the like refer to non-physical media which carry software instructions in the form of computer-readable program code that allows performance of embodiments of the present disclosure. Thus, by way of example, and not limitation, embodiments of the present disclosure can include at least two distinct and different kinds of computer-readable media, namely storage media and/or transmission media. Combinations of storage media and transmission media should be included within the scope of computer-readable media.

To further illustrate the distinct nature of storage media and transmission media, storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or solid state drives, or other types of storage devices.

Transmission media may conversely include communications networks or other data links that enable the transport of electronic data between computer systems and/or modules, engines, and/or other electronic devices. When information is transferred or provided over a communication network or another communications connection (either hardwired, wireless, or a combination of hardwired or wireless) to a computing device, the computing device properly views the connection as a transmission medium. Transmission media can therefore include a communication network and/or data links, carrier waves, wireless signals, and the like, which can be used to carry desired program, code means, or instructions.

Note that the instructions discussed above may be provided on one computer-readable or machine-readable medium, or may be provided on multiple computer-readable or machine-readable media distributed in a large system having possibly plural nodes. Such computer-readable or machine-readable medium or media is (are) considered to be part of an article (or article of manufacture). An article or article of manufacture may refer to any manufactured single component or multiple components. The computer-readable medium or media may be located either in the machine running the machine-readable instructions, or located at a remote site from which machine-readable instructions may be downloaded over a network for execution. Further, where transmission media is used, upon reaching various computing system components, program code in the form of computer-executable instructions or data structures can be transferred automatically or manually from transmission media to storage media (or vice versa). For example, computer-executable instructions or data structures received over a network or data link can be buffered in memory-type storage media (e.g., RAM) within a network interface module (NIC), and then eventually transferred to computer system RAM and/or to less volatile storage media (e.g., a hard drive) at a computer system. Thus, it should be understood that storage media can be included in computer system components that also (or even primarily) utilize transmission media.

It should be appreciated that described computing systems are merely examples of computing systems, and that a computing system may have more or fewer components than described, may combine additional components not described, or may have a different configuration or arrangement of the components. The various components of a computing system may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device, and/or through manual control by a user who may make determinations regarding whether a given event, action, template, model, or set of charts has become sufficiently accurate for the evaluation of the planning or borehole condition data under consideration.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The embodiments described herein overcome disadvantages and shortcomings of existing systems and methods. For example, the embodiments described herein facilitate the control of downhole cleaning operations by, for example, orchestrating use of pumps, off-bottom events, drilling stoppages, and mud formulations, via substantially real-time downhole and/or surface measurements and planning processes. For example, in certain embodiments, use of a well plan is combined with surface direct or comparative measurements (e.g., weight, rotational speed, ROP, or changes thereto, etc.), downhole measurements (e.g., weight, rotational speed, ROP, vibration, or changes thereto, etc.)

The specific embodiments described above have been illustrated by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for generating and iteratively updating plans, comprising:

establishing a communication connection between a solver and a generic planner;

generating, at the generic planner, a wellbore plan for drilling a wellbore via an automated drilling system, wherein the generating is independent of physical conditions of the wellbore and does not use any physics-based model at the generic planner, wherein the wellbore plan includes one or more recommended drilling operations and state data comprising one or more drilling parameters associated with the wellbore plan, and wherein the one or more recommended drilling operations include a schedule for cleaning operations having a cleaning operation frequency;

performing, at the solver, a simulation of one or more effects of the one or more recommended drilling operations on the physical conditions of the wellbore, wherein the simulating is based on a physics-based model of the physical conditions of the wellbore using the state data;

causing the automated drilling system to drill the wellbore according to the one or more recommended drilling operations of the wellbore plan;

while drilling the wellbore, updating the state data with measured drilling conditions, resulting in updated state data;

performing, at the solver, an updated simulation of the one or more effects of the one or more recommended drilling operations on the physical conditions of the wellbore;

evaluating, based on the updated simulation, at least one of the one or more recommended drilling operations in a straight section of the wellbore;

updating, at the generic planner based on the evaluating, the wellbore plan to decrease the cleaning operation frequency of the cleaning operations in the schedule in the straight section of the wellbore, resulting in the schedule for the cleaning operations being less conservative than a current fixed schedule of the cleaning operations; and causing the automated drilling system to drill the wellbore in the straight section according to the one or more recommended drilling operations of the wellbore plan and perform the cleaning operations according to the decreased cleaning operation frequency.

2. The method of claim 1, further comprising predicting, at the solver, based on the simulation that is based on the physics-based model, at least one operation that, when performed by the automated drilling system, improves efficiency and safety of a wellsite.

3. The method of claim 1, further comprising, during the simulation, evaluating a plurality of operations.

4. The method of claim 3, wherein evaluating the plurality of operations includes evaluating trade-offs of risk against cost.

5. A method by a generic planner that is designed to generate a wellbore plan without considering borehole conditions, the method comprising:

generating the wellbore plan to drill a wellbore using a modeling language incapable of considering the borehole conditions, wherein the generating is independent of physical conditions of the wellbore and does not use any physics-based model at the generic planner, and wherein the wellbore plan includes one or more recommended drilling operations and state data comprising one or more drilling parameters associated with the wellbore plan, wherein the one or more recommended drilling operations include a schedule for cleaning operations having a cleaning operation frequency;

converting the state data into a data format usable by a borehole condition simulator;

transmitting a query with the converted state data to the borehole condition simulator, the borehole condition simulator being configured to generate a borehole simulation, using a simulation language that uses the physical conditions of the wellbore and a physics-based model, based on the state data;

receiving a response to the query from the borehole condition simulator, the response to the query being based on the borehole simulation;

causing an automated drilling system to drill the wellbore according to the one or more recommended drilling operations of the wellbore plan;

while drilling the wellbore, updating the state data with measured drilling conditions, resulting in updated state data;

querying the borehole condition simulator to generate an updated borehole simulation;

evaluating, based on the updated borehole simulation, at least one of the one or more recommended drilling operations in a straight section of the wellbore;

updating, based on the evaluating, the wellbore plan to decrease the cleaning operation frequency of the cleaning operations in the schedule in the straight section of the wellbore, resulting in the schedule for the cleaning operations being less conservative than a current fixed schedule of the cleaning operations; and causing the automated drilling system to drill the wellbore in the straight section according to the one or more recommended drilling operations of the wellbore plan and perform the cleaning operations according to the decreased cleaning operation frequency.

6. The method of claim 5, further comprising identifying a trigger condition satisfied by the wellbore plan, and wherein transmitting the query is in response to the identifying.

7. The method of claim 6, wherein identifying the trigger condition includes identifying the trigger condition from measurements received from the wellbore.

8. The method of claim 5, wherein transmitting the query includes preparing an interface object, including the query and the converted state data.

9. The method of claim 7, wherein the query is based on the trigger condition, the trigger condition including a drilling parameter value.

10. The method of claim 8, wherein:

the interface object is a first interface object;

the response is a first response;

the state data is first state data; and the method further comprises:

after receiving the first response, preparing a second interface object based on the first response, the second interface object including second state data;

transmitting the second interface object to the borehole condition simulator; and receiving a second response to the query from the borehole condition simulator, the second response to the query being based on the second state data.

11. A wellbore planning and simulation system implemented by a generic planner, the wellbore planning and simulation system comprising:

a processor; and memory including instructions accessible by the processor to cause the processor to:

generate a wellbore plan to drill a wellbore using the generic planner, the generic planner generating the wellbore plan using a modeling language incapable of considering wellbore conditions, wherein the generating is independent of physical conditions of the wellbore and does not use any physics-based model at the generic planner, wherein the wellbore plan includes one or more recommended drilling operations and state data comprising one or more drilling parameters associated with the wellbore plan, and wherein the one or more recommended drilling operations include a schedule for cleaning operations having a cleaning operation frequency;

convert the state data into a data format usable by a borehole condition simulator;

transmit a query with the state data and the query to a borehole condition simulator, the borehole condition simulator being configured to generate a borehole simulation using the state data; and receive a response to the query from the borehole condition simulator, the response to the query being based on the borehole simulation;

cause an automated drilling system to drill the wellbore according to the one or more recommended drilling operations of the wellbore plan;

while drilling the wellbore, update the state data with measured drilling conditions, resulting in updated state data;

query the borehole condition simulator to generate an updated borehole simulation;

evaluate, based on the updated borehole simulation, at least one of the one or more recommended drilling operations in a straight section of the wellbore;

update, based on the evaluating, the wellbore plan to decrease the cleaning operation frequency of the cleaning operations in the schedule in the straight section of the wellbore, resulting in the schedule for the cleaning operations being less conservative than a current fixed schedule of the cleaning operations; and cause the automated drilling system to drill the wellbore in the straight section according to the one or more recommended drilling operations of the wellbore plan and perform the cleaning operations according to the decreased cleaning operation frequency.

12. The wellbore planning and simulation system of claim 11, wherein transmitting the query includes preparing an interface object including the query and the converted state data.

13. The wellbore planning and simulation system of claim 12, wherein the memory includes instructions which further cause the processor to identify a trigger condition satisfied by the wellbore plan, and wherein preparing the interface object includes preparing the interface object in response to the identifying.

14. The wellbore planning and simulation system of claim 12, wherein the interface object is a first interface object, the response is a first response, and the state data is first state data, and wherein the memory includes instructions which further cause the processor to:

after receiving the first response, prepare a second interface object based on the first response, the second interface object including second state data;

transmit the second interface object to the borehole condition simulator; and receive a second response to the query from the borehole condition simulator, the second response to the query being based on the second state data.

15. The method of claim 5, further comprising:

identifying a trigger condition satisfied by the wellbore plan, and wherein transmitting the query is in response to the identifying, wherein:

identifying the trigger condition includes identifying the trigger condition from measurements received from the wellbore;

transmitting the query includes preparing an interface object including the query and the converted state data;

the query is based on the trigger condition, the trigger condition including a drilling parameter value;

the interface object is a first interface object;

the response is a first response; and the state data is first state data;

after receiving the first response, preparing a second interface object based on the first response, the second interface object including second state data;

transmitting the second interface object to the borehole condition simulator; and receiving a second response to the query from the borehole condition simulator, the second response to the query being based on the second state data.

16. The wellbore planning and simulation system of claim 11, wherein:

transmitting the query includes preparing an interface object including the query and the converted state data;

the memory includes instructions which further cause the processor to identify a trigger condition satisfied by the wellbore plan;

preparing the interface object includes preparing the interface object in response to the identifying;

the interface object is a first interface object;

the response is a first response;

the state data is first state data; and the memory includes instructions which further cause the processor to:

after receiving the first response, prepare a second interface object based on the first response, the second interface object including second state data;

transmit the second interface object to the borehole condition simulator; and receive a second response to the query from the borehole condition simulator, the second response to the query being based on the second state data.

17. The method of claim 1, further comprising updating, based on the evaluating, the wellbore plan to increase the cleaning operation frequency of the cleaning operations in the schedule in a curved section of the wellbore.

* * * * *